(12) United States Patent
Matsuoka et al.

(10) Patent No.: US 11,413,595 B2
(45) Date of Patent: Aug. 16, 2022

(54) FLUID FLOW DEVICE AND FLOW ERROR DETECTION METHOD

(71) Applicant: KOBE STEEL, LTD., Hyogo (JP)

(72) Inventors: Akira Matsuoka, Kobe (JP); Koji Noishiki, Takasago (JP); Tomohiro Ozono, Takasago (JP)

(73) Assignee: Kobe Steel, Ltd., Hyogo (JP)

( * ) Notice: Subject to any disclaimer, the term of this patent is extended or adjusted under 35 U.S.C. 154(b) by 287 days.

(21) Appl. No.: 16/629,517

(22) PCT Filed: Jun. 26, 2018

(86) PCT No.: PCT/JP2018/024243
§ 371 (c)(1),
(2) Date: Jan. 8, 2020

(87) PCT Pub. No.: WO2019/017166
PCT Pub. Date: Jan. 24, 2019

(65) Prior Publication Data
US 2020/0122111 A1   Apr. 23, 2020

(30) Foreign Application Priority Data
Jul. 20, 2017  (JP) .............................. JP2017-140492

(51) Int. Cl.
*B01J 19/00* (2006.01)
*B01F 33/30* (2022.01)
*B81B 1/00* (2006.01)

(52) U.S. Cl.
CPC ........... *B01J 19/0093* (2013.01); *B01F 33/30* (2022.01); *B01J 2219/0086* (2013.01);
(Continued)

(58) Field of Classification Search
CPC ......... B01L 3/502707; B01L 3/502715; B01L 3/502738; B01L 2300/14;
(Continued)

(56) References Cited

U.S. PATENT DOCUMENTS 7,049,622 B1   5/2006  Weiss
2003/0141456 A1  7/2003  McNeal et al.
(Continued)

FOREIGN PATENT DOCUMENTS

JP   2005-345160 A   12/2005
WO     03060433 A2    7/2003
WO   2005116662 A1   12/2005

OTHER PUBLICATIONS

The extended European search report issued by the European Patent Office dated Dec. 14, 2020, which corresponds to European Patent Application No. 18834330.5.
(Continued)

*Primary Examiner* — Lyle Alexander
*Assistant Examiner* — Dwayne K Handy
(74) *Attorney, Agent, or Firm* — Studebaker & Brackett PC

(57) ABSTRACT

Provided is a fluid flow device having high freedom of choosing means for detecting flow errors. The fluid flow device includes a channel forming body. The channel forming body forms a plurality of fluid channels, a plurality of detection spaces corresponding to the fluid channels, respectively, and a plurality of communication channels providing respective communications between the fluid channels and the detection spaces corresponding thereto, respectively. Each of the detection spaces contains a detection fluid and a detection gas aligned in a longitudinal direction thereof, and an interface is formed therebetween. The detection gas is contained in the detection space so as to allow the position of the interface to be changed with the pressure change of a processing object fluid that flows through the fluid channels.

20 Claims, 25 Drawing Sheets

(52) U.S. Cl.
CPC ............. *B01J 2219/00783* (2013.01); *B01J 2219/00873* (2013.01); *B01J 2219/00889* (2013.01); *B01L 2300/0887* (2013.01); *B81B 1/00* (2013.01)

(58) Field of Classification Search
CPC ..... B01L 2300/0654; B01L 2300/0887; G01N 2021/0162; G01N 2021/058; B01J 2219/00889; B01J 2219/0097; B01J 19/0093; B01J 2219/00783
See application file for complete search history.

(56) References Cited

U.S. PATENT DOCUMENTS

| | | |
|---|---|---|
| 2014/0102214 A1 | 4/2014 | Noishiki et al. |
| 2014/0138260 A1* | 5/2014 | Briman ................ B01L 3/5027 205/775 |
| 2015/0323937 A1 | 11/2015 | Murakami |

OTHER PUBLICATIONS

Notification of Transmittal of Translation of the International Preliminary Report on Patentability (Chapter 1) and Translation of Written Opinion of the International Searching Authority, PCT/JP2018/024243, dated Jan. 30, 2020.

* cited by examiner

FLUID FLOW DEVICE AND FLOW ERROR DETECTION METHOD

TECHNICAL FIELD

The present invention relates to a fluid flow device which forms a plurality of channels in which a processing object fluid flows aiming at chemical operation such as reaction and extraction of the processing object fluid and heat exchange, and a method for detecting flow errors.

BACKGROUND ART

As a device which form a passage for causing a processing object fluid to flow, well known is a device recited in Patent Literature 1. The device recited in the literature includes a channel structure which forms a plurality of micro-channels (fine channels). The plurality of micro-channels meander on a predetermined plane while extending so as to be parallel to each other, allowing a processing object fluid to flow along the micro-channels.

However, being fine, the micro-channel can cause a flow error due to an increase in the viscosity or a pressure drop or due to foreign substances contained in the processing object fluid or the like; in the worst case, closure may occur. The flow error is preferably detected and treated such as cleaning quickly.

In the fluid flow device recited in the literature, there are formed, as means for detecting such a flow error as described above, a plurality of communication channels providing communication between the fluid channels and the outside of the device in addition to the original fluid channel. The communication channels allow a pressure of a processing object fluid at a plurality of positions in the fluid channel to be detected through the communication channels, thereby enabling presence/absence of a pressure drop error caused by a flow error of a processing object fluid in the fluid channel to be detected.

The device, however, should have pressure detectors connected to the plurality of communication channels, as means for detecting a flow error. In other words, the means for detecting the flow error is restricted to a plurality of pressure detectors connected to the communication channels, respectively, which extremely reduces degree of freedom of choosing the means. This makes it difficult to select detection means in accordance with various conditions such as precision and work simplicity required for detecting the flow error.

CITATION LIST

Patent Literature

Patent literature 1: U.S. Pat. No. 5,885,548 (FIG. 3)

SUMMARY OF INVENTION

An object of the present invention is to provide a fluid flow device which forms a plurality of fluid channels through which a processing object fluid is caused to flow, the device having a high degree of freedom of choosing means for detecting a flow error of a processing object fluid in the fluid channel.

Provided is a fluid flow device including a channel forming body which forms a plurality of fluid channels that allow respective processing object fluids to flow through the fluid channels, a plurality of detection spaces corresponding to the plurality of fluid channels, each of the plurality of spaces extending in a longitudinal direction and having opposite ends with respect to the longitudinal direction, at least one of the opposite ends being sealed, and a plurality of communication channels each connected to a channel connection part that is set at each of the plurality of fluid channels and to a space connection part that is set in the detection space corresponding to the fluid channel to thereby provide communication between the channel connection part and the space connection part; and detection liquids and detection gases that are contained in the plurality of detection spaces, respectively. Each of the detection liquids and each of the detection gases are contained in the detection space so as to be aligned in the longitudinal direction of the detection space to form an interface between the detection liquid and the detection gas and so that a region where the detection liquid exists includes the space connection part. The detection gas is contained in the detection space so as to allow a position of the interface to change with a pressure change of the processing object fluid at the channel connection part.

DESCRIPTION OF EMBODIMENTS

Figure 1:
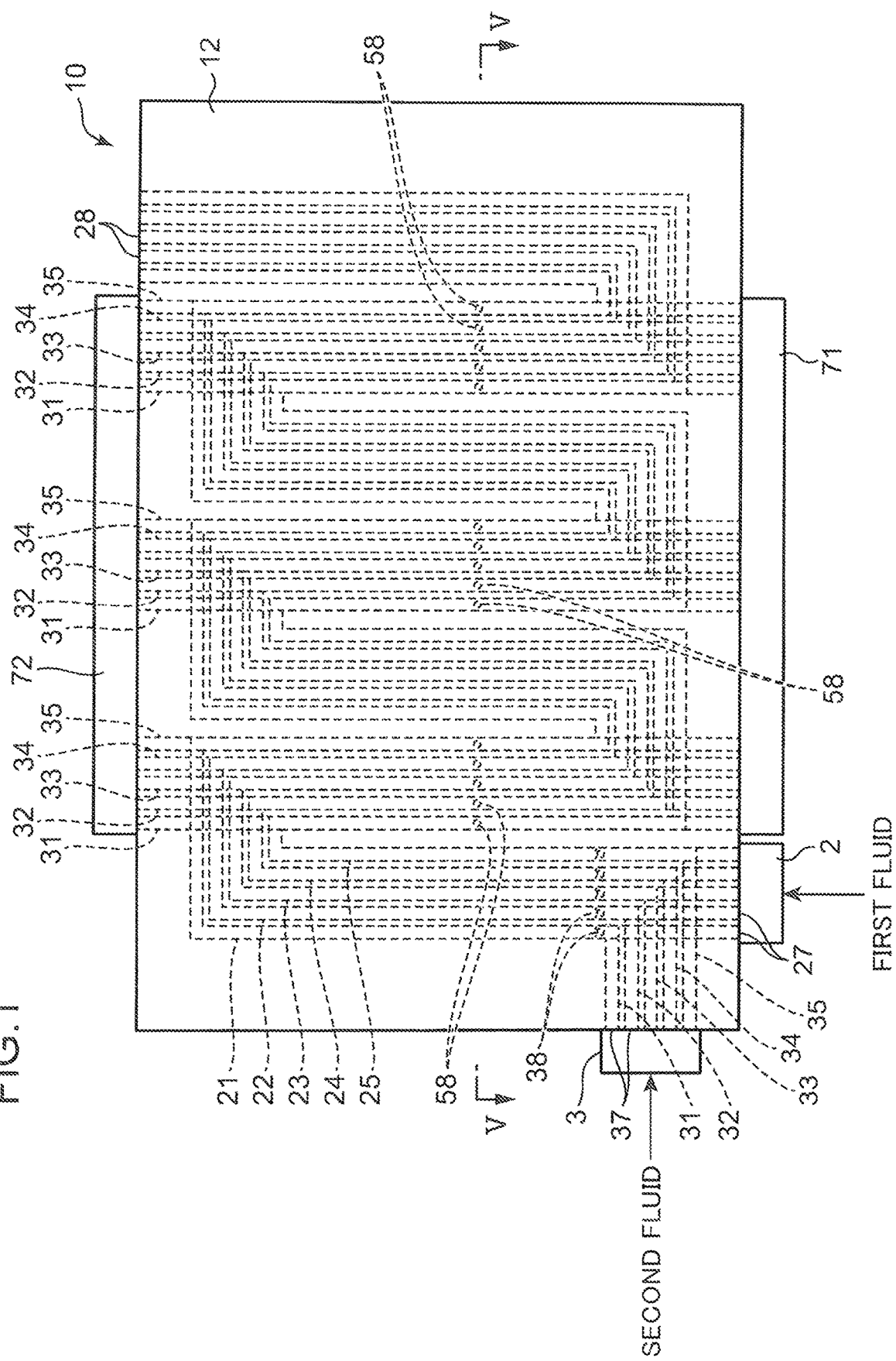
FIG. 1 is a front view of a micro-channel reactor as a fluid flow device according to a first embodiment of the present invention.

Preferred embodiments of the present invention will be described with reference to the drawings.

FIG. 1 to FIG. 8 show a micro-channel reactor as a fluid flow device according to a first embodiment of the present invention. The micro-channel reactor includes a channel forming body 10. The channel forming body 10 is a block body that forms a plurality of reaction channels and a plurality of introduction channels corresponding to the plurality of reaction channels, respectively. Each of the plurality of reaction channels is a channel for mixing a first fluid as a processing object fluid to be caused to flow through the reaction channel and a second fluid as a processing object fluid to be introduced into the reaction channel through the introduction channel to thereby cause chemical reaction between both the liquids, the reaction channel being a fluid channel allowing the first and second fluids to flow while having a fine channel area.

The channel forming body 10 includes a plurality of (three in this embodiment) channel forming plates 11 laminated together in a plate thickness direction, a front side outer plate 12 and a back side outer plate 13 arranged at both outer sides of the channel forming plates 11 in the plate thickness direction, and a plurality of (two in this embodiment) partition plates 16 interposed between the channel forming plates 11 adjacent to each other. The lamination state of these plates 11, 12, 13, and 16 is retained by, for example, joining of plates adjacent to each other by welding or the like, or fastening by bolts or the like in the plate thickness direction.

Figure 2:
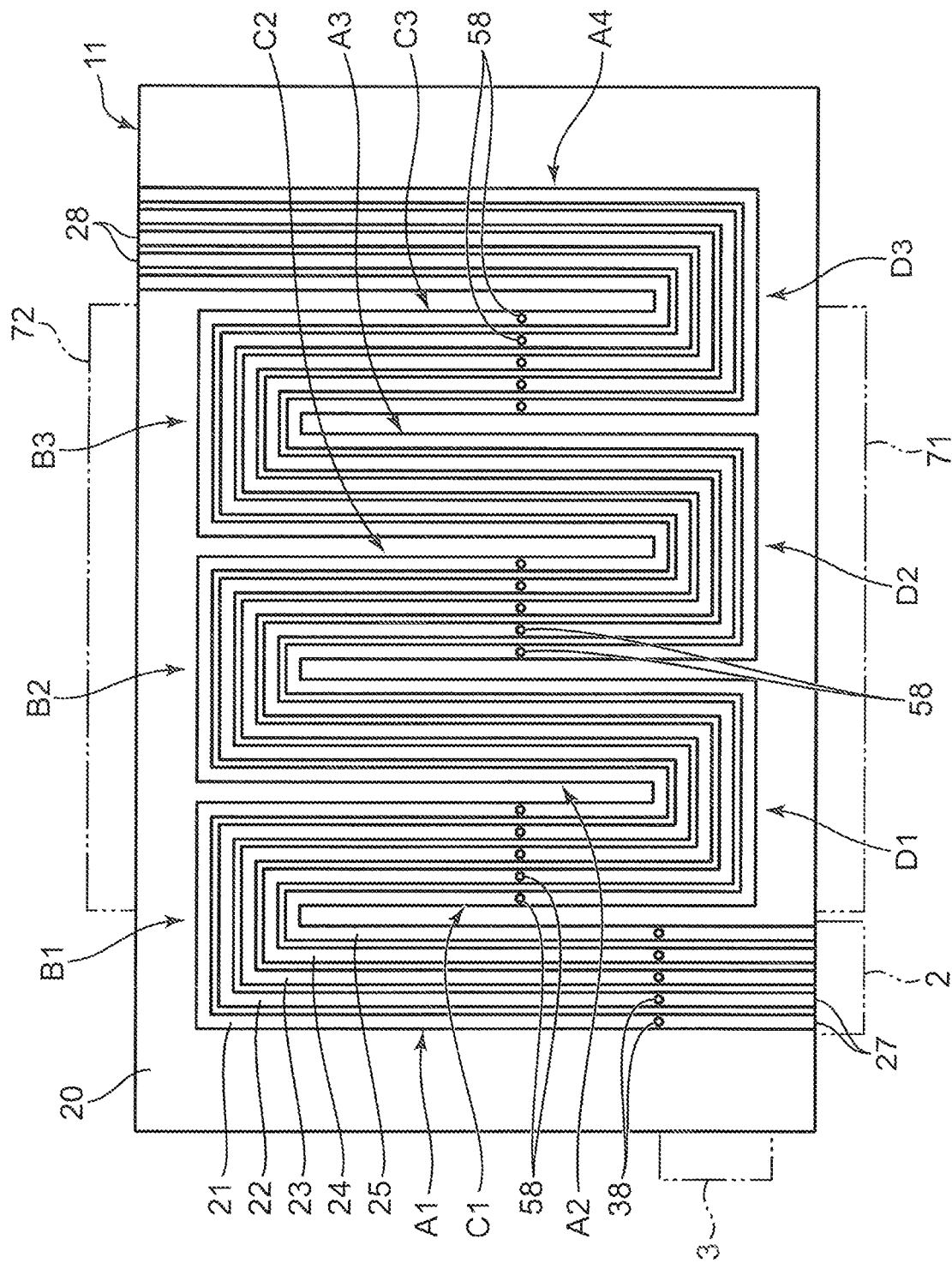
FIG. 2 is a front view of a channel forming plate configuring the micro-channel reactor shown in FIG. 1.
Figure 3:
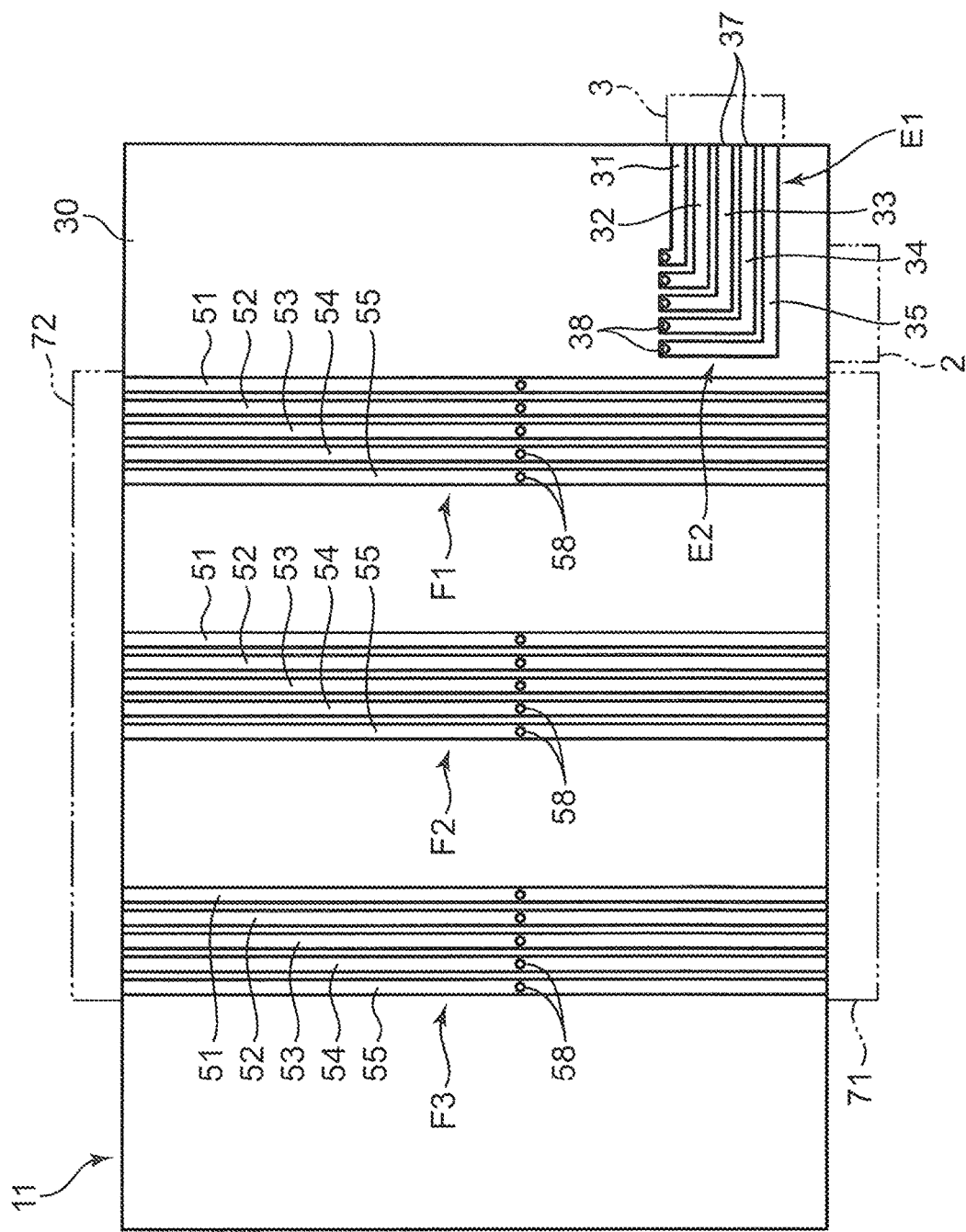
FIG. 3 is a back view of the channel forming plate shown in FIG. 2.
Figure 4:
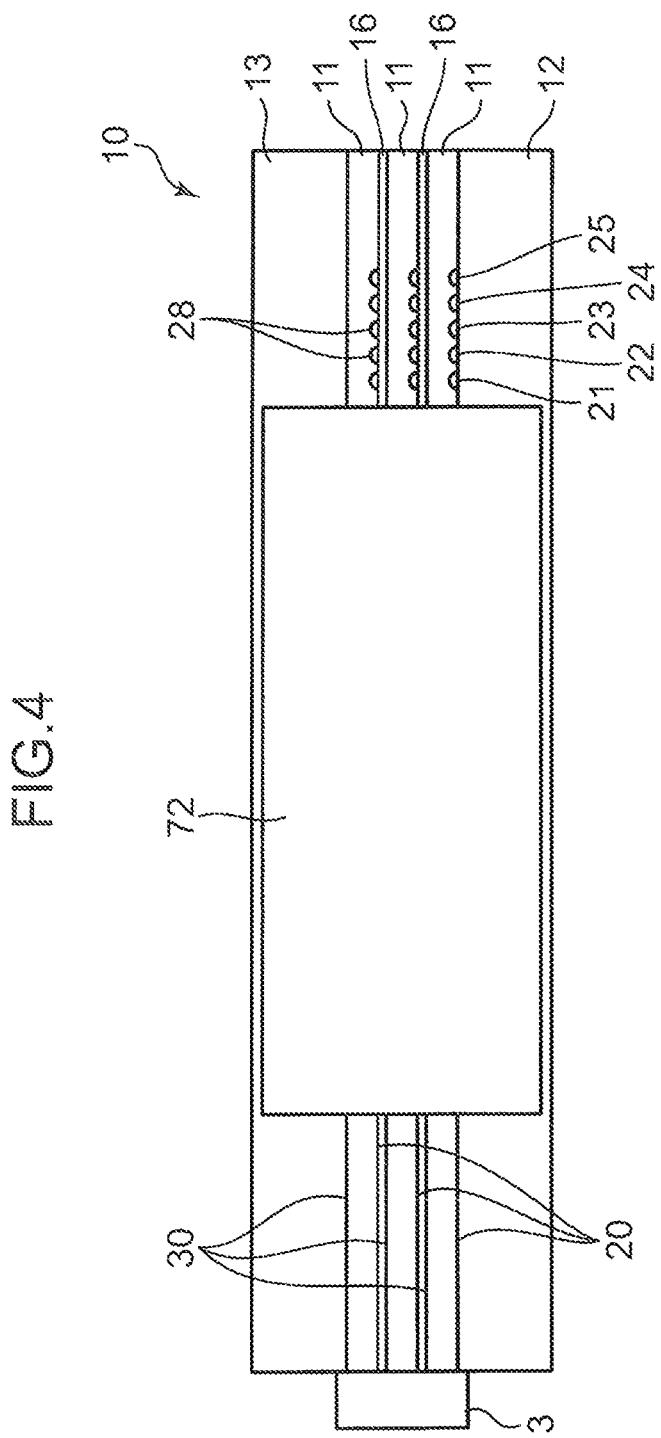
FIG. 4 is a plan view showing the micro-channel reactor shown in FIG. 1.
Figure 5:
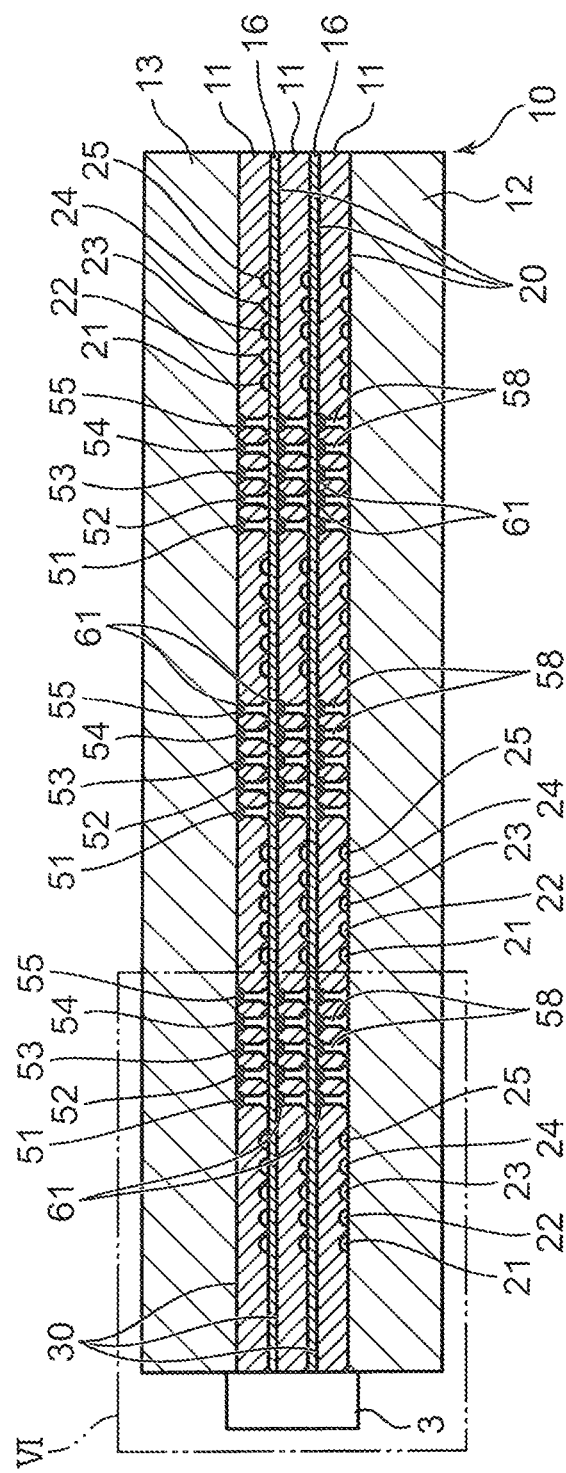
FIG. 5 is a plan view showing a cross-section taken along line V-V shown in FIG. 1.

Each of the plurality of channel forming plates 11 has a front side surface (a first plane) 20 shown in FIG. 2, and a back side surface (a second plane) 30 which is a surface opposite to the front side surface and is shown in FIG. 3. The front side surface 20 is formed with a plurality (five in this embodiment) of reaction-channel forming grooves 21, 22, 23, 24, and 25 for configuring the plurality of reaction channels. The reaction-channel forming grooves 21 to 25, and the back side surface of the partition plate 16 making close contact with the front side surface 20 or the back side surface of the front side outer plate 12, define a reaction channel having the same shape as those of the reaction-channel forming grooves 21 to 25. The back side surface 30 is formed with a plurality (five in this embodiment) of introduction-channel forming grooves 31, 32, 33, 34, and 35 for forming the plurality of introduction channels which correspond to the plurality of reaction-channel forming grooves 21, 22, 23, 24, and 25, respectively. The introduction-channel forming grooves 31 to 35, and a front side surface of the partition plate 16 making close contact with the back side surface 30 or a front side surface of the back side outer plate 13, define an introduction channel having the same shape as those of the introduction-channel forming grooves 31 to 35.

The reaction-channel forming grooves 21 to 25 formed in the front side surface 20 meander vertically while extending parallel to each other. Specifically, the area in which the reaction-channel forming grooves 21 to 25 are formed is divided into a plurality of sections aligned sequentially from an upstream end of the grooves, specifically, into 13 sections including a first upward channel section A1, a first upper interconnection section B1, a first downward channel section C1, a first lower interconnection section D1, a second upward channel section A2, a second upper interconnection section B2, a second downward channel section C2, a second lower interconnection section D2, a third upward channel section A3, a third upper interconnection section B3, a third downward channel section C3, a third lower interconnection section D3, and a fourth upward channel section A4.

In the first to fourth upward channel sections A1 to A4, each of the reaction-channel forming grooves 21 to 25 extends vertically to allow a processing object fluid to flow upward. The first to fourth upward channel sections A1 to A4 are aligned in a right-left direction of the channel forming plate 11 at an interval. In the first upward channel section A1 on the most upstream side (left side in FIG. 2) of the sections, respective upstream ends (lower ends in FIG. 2) of the reaction-channel forming grooves 21 to 25 lead to a lower end surface of the channel forming plate 11 to form first fluid inlets 27 opened downward. Conversely, in the fourth upward channel section A4 on the most downstream side (right side in FIG. 2), respective downstream ends (upper ends in FIG. 2) of the reaction-channel forming grooves 21 to 25 lead to an upper end surface of the channel forming plate 11 to form fluid outlets 28 opened upward.

In the first to third downward channel sections C1 to C3, each of the reaction-channel forming grooves 21 to 25 extend vertically to allow a processing object fluid to flow downward. The first to third downward channel sections C1 to C3 are adjacent to the first to third upward channel sections A1 to A3 on their respective right sides, seen from the front.

In the first to third upper interconnection sections B1 to B3, each of the reaction channels 21 to 25 extend in the right-left direction in the upper portion of the channel forming plate 11 in the right-left direction to interconnect respective downstream ends (upper ends) of the first to third upward channel sections A1 to A3 and respective upstream ends (upper ends) of the first to third downward channel forming sections C1 to C3 on the immediately downstream side (the right side in FIG. 2) of the first to third upward channel sections in the right-left direction. Similarly, in the first to third lower interconnection sections D1 to D3, the reaction channels 21 to 25 extend in the right-left direction in the lower portion of the channel forming plate 11 to interconnect respective downstream ends (lower ends) of the first to third downward channel sections C1 to C3 and respective upstream ends (lower ends) of the second to fourth upward channel forming sections A2 to A4 on the immediately downstream side (the right side in FIG. 2) of the first to third downward channel sections in the right-left direction.

The introduction-channel forming grooves 31 to 35 have respective shapes bending in an L-shape while extending in parallel to each other as shown in FIG. 3 to introduce the second fluid into the upstream side end portions of the reaction channels 21 to 25. Specifically, the area in which the introduction-channel forming grooves 31 to 35 are formed is divided into a first introduction section E1 extending leftward from a right end surface of the channel forming plate 11 and a second introduction section E2 extending upward from a terminal of the first introduction section E1 seen from the back side. Respective upstream ends of the introduction-channel forming grooves 31 to 35 in the first introduction section E1 form a second fluid inlet 37 opened on the right side seen from the back side. In the second introduction section E2, the introduction-channel forming grooves 31 to 35 extend upward, by an appropriate length, at a position exactly opposite to the corresponding reaction-channel forming grooves 21 to 25, along the reaction-channel forming grooves 21 to 25.

Furthermore, the channel forming body 20 is formed with a plurality (five in this embodiment) of introduction holes 38. The plurality of introduction holes 38 are through holes extending in the plate thickness direction and providing respective terminals (upper ends in FIG. 3) of the respective introduction-channel forming grooves 31 to 35 and the corresponding reaction-channel forming grooves 21 to 25. The introduction holes 38 enable the second fluid supplied to the introduction channels defined by the introduction-channel forming grooves 31 to 35 to be introduced into the respective reaction channels defined by the reaction-channel forming grooves 21 to 25 through the introduction holes 38.

Respective first fluid inlet 27 of the reaction channels are connected with a first fluid input header 2 for supplying the first fluid to the first fluid inlets 27. The first fluid input header 2 is attached to the lower end surface of the channel forming body 10 so as to cover each of the first fluid inlets 27. Similarly, respective second fluid inlet 37 of the introduction channels are connected with a second fluid input header 3 for supplying the second fluid to the second fluid inlet 37. The second fluid input header 3 is attached to the side end surface (a left side end surface seen from the front, a right side end surface seen from the back) of the channel forming body 10 so as to cover each of the respective second fluid inlets 37. Similarly, the fluid outlets 28 are connected with a not-graphically-shown output header for receiving a processing object fluid which is discharged from the fluid outlet 28.

In the channel forming body 10, the first fluid is supplied to respective first fluid inlets 27 of the reaction channels defined by the reaction-channel forming grooves 21 to 25 and the like and the second fluid is supplied to respective second fluid inlets 37 of the introduction channels defined by the introduction-channel forming grooves 31 to 35 and the like, the second fluid being introduced into the reaction channels through the introduction holes 38 to be thereby joined with the first fluid. The thus mixed first and second fluids react with each other during their flows through the reaction channels, and the fluid generated through the reaction is discharged through the fluid outlets 28.

Being fine, the micro-channels formed by the channel forming body 10 can cause a flow error due to an increase in the viscosity or a pressure drop or due to foreign substances contained in the processing object fluid or the like; in the worst case, closure may occur. The flow error is preferably detected and treated such as cleaning quickly.

As means for detecting the flow error, the micro-channel reactor includes a plurality of detection spaces for detection and a plurality of communication channels corresponding to the respective detection spaces, a detection liquid 61 and a detection gas 62 that are contained in the plurality of detection spaces, and an interface position detector which detects a position of an interface 64 between the detection liquid 61 and the detection gas 62, the interface position detector including a light emitting device 71 and a light receiving device 72. Details of the means for detecting a flow error are as follows.

1) Detection Space and Communication Channel

The plurality of detection spaces and communication channels are formed by the channel forming body 10 similarly to the plurality of reaction channels. Specifically, the back side surface 30 of each of the channel forming plate 11 of the channel forming body 10 is formed with a plurality of (five in this embodiment) detection-space forming grooves 51, 52, 53, 54, and 55 in each of a first detection region F1, a second detection region F2, and a third detection region F3, in addition to the plurality of introduction-channel forming grooves 31 to 35, and a plurality of communication holes 58 corresponding to the detection-space forming grooves 51 to 55, respectively.

The first to third detection regions F1 to F3 are respective regions corresponding to the first to third downward channel sections C1 to C3 of the reaction-channel forming grooves 21 to 25. The detection-space forming grooves 51 to 55 extend vertically along the reaction-channel forming grooves 21 to 25 at a position exactly opposite to the reaction-channel forming grooves 21 to 25 in the first to third downward channel sections C1 to C3. The detection-space forming grooves 51 to 55 preferably have respective same widths as those of the reaction-channel forming grooves 21 to 25, respectively.

The detection-space forming grooves 51 to 55 define respective detection spaces having the same shapes as those of the detection-space forming grooves 51 to 55, respectively, in collaboration with the front side surface of the partition plate 16 making close contact with the back side surface 30 or in collaboration with the front side surface of the back side outer plate 13 making close contact with the back side surface 30. In this embodiment, respective upper ends and respective lower ends of the detection-space forming grooves 51 to 55 lead to the upper end surface and the lower end surface of the channel forming plate 11, respectively. Each of the detection spaces, therefore, has a shape extending vertically and having respective openings on the upper and lower sides thereof. As will be described later, among the openings, all the lower openings are sealed by the light emitting device 71 and all the upper openings are sealed by the light receiving device 72.

Each of the plurality of communication holes 58 forms the above-described communication channel, which is a communication channel connected to a channel connection part that is set at an appropriate height in each of the plurality of fluid channels and a space connection part that is set in the detection space corresponding to the fluid channel to thereby provide communication between the channel connection part and the space connection part. Specifically, the plurality of communication holes 58 pass through the channel forming plate 11 in the plate thickness direction thereof from respective bottom portions of the reaction-channel forming grooves 21 to 25 corresponding to the channel connection part to respective bottom portions of the detection-space forming grooves 51 to 55 corresponding to the space connection part.

2) Detection Liquid 61 and Detection Gas 62

The detection liquid 61 and the detection gas 62 are aligned in each of the detection spaces in their respective longitudinal directions to form the interface 64 between the detection liquid 61 and the detection gas 62. In this embodiment, the detection liquid 61 and the detection gas 62 are contained in the detection spaces so as to locate the detection gas 62 upward of the detection liquid 61, in other words, so as to bring the detection liquid 61 and the detection gas 62 into contact with the light emitting device 71 and the light receiving device 72, respectively.

Figure 6:
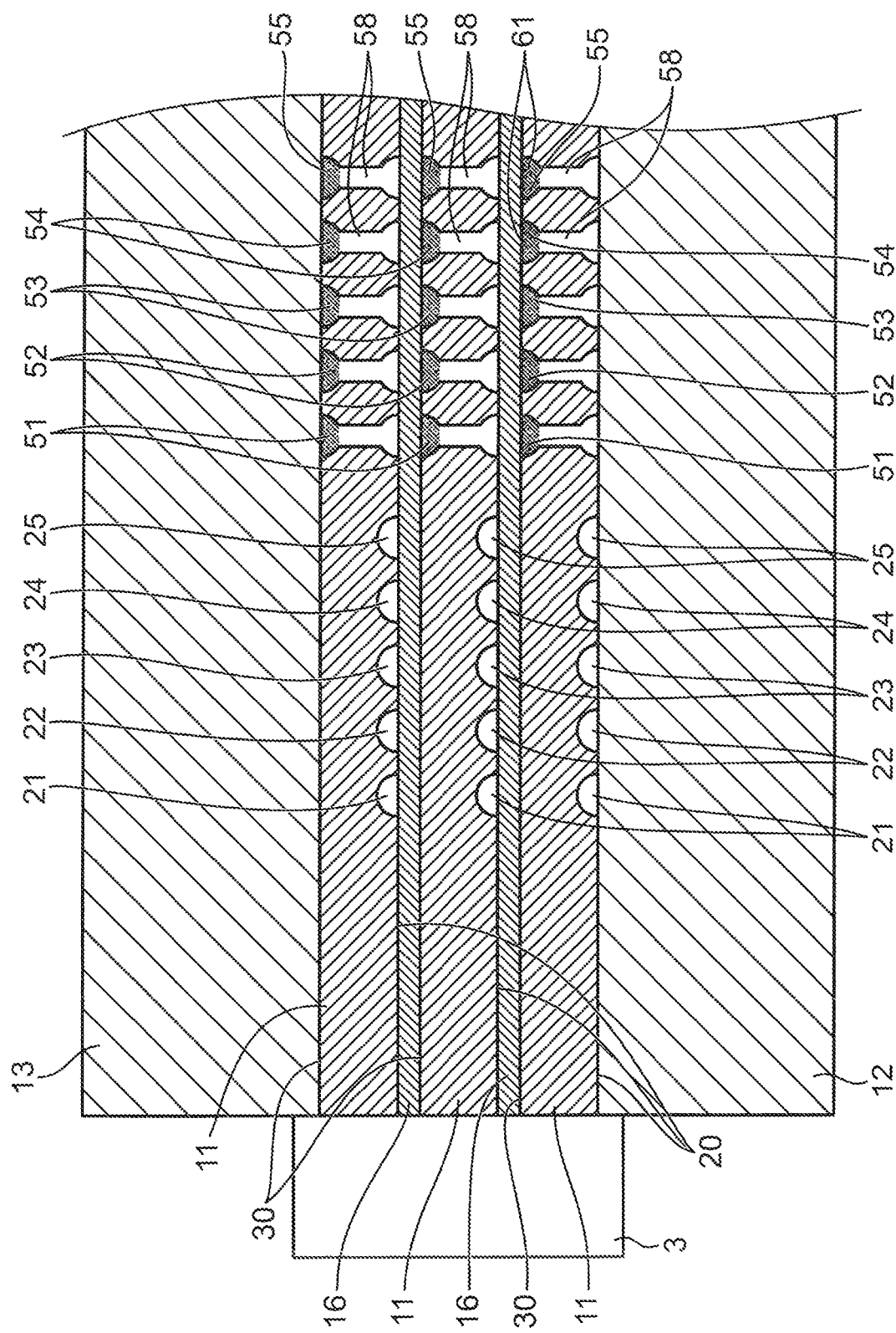
FIG. 6 is a sectional plan view showing, in an enlarged manner, a part surrounded by line VI shown in FIG. 5.
Figure 7:
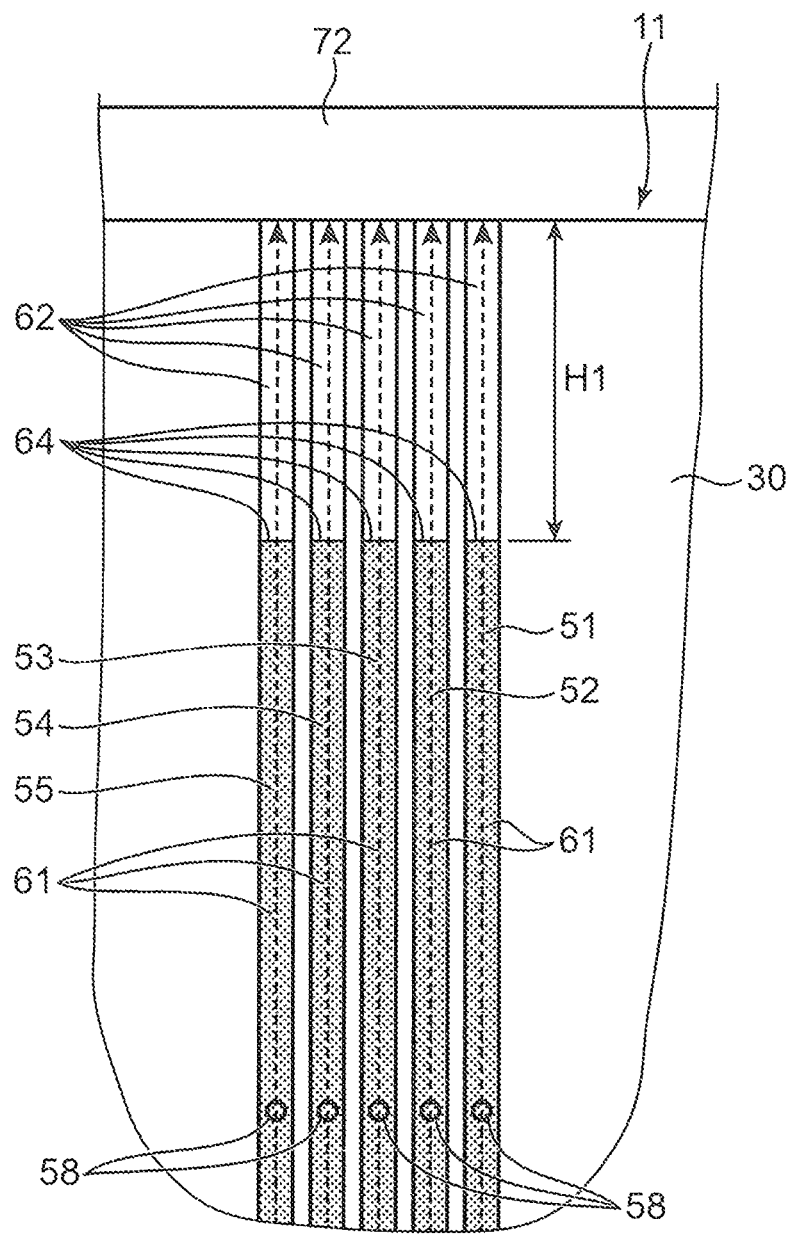
FIG. 7 is a front view showing an interface between a detection liquid and a detection gas in each detection space when a flow state of each reaction channel in the micro-channel reactor shown in FIG. 1 is normal.
Figure 8:
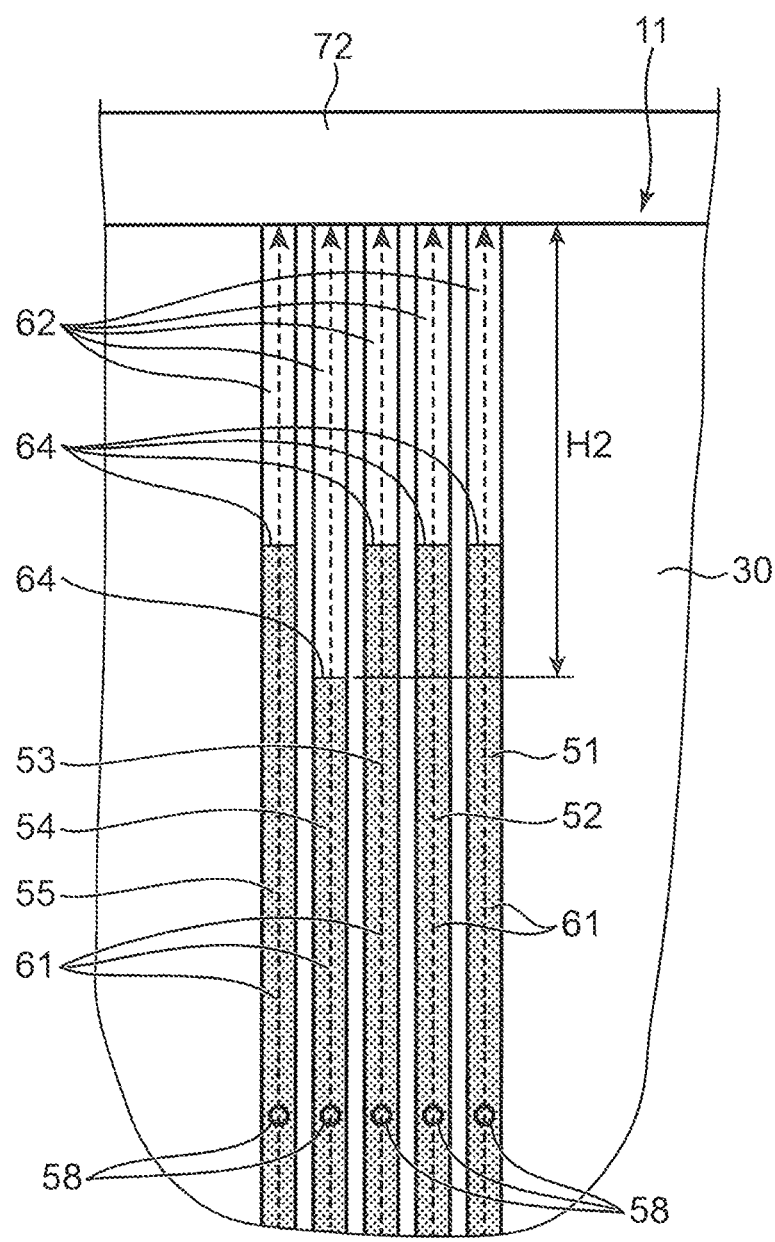
FIG. 8 is a front view showing an interface between a detection liquid and a detection gas in each detection space when a flow state of a part of the reaction channels in the micro-channel reactor shown in FIG. 1 involves an error.

The position of the interface 64 is set at an initial position shown in FIG. 7 when the use of the micro-channel reactor is started. The initial position is the position of the interface 64 when the processing object fluid flows normally (i.e. with no flow error) in each of the reaction channels. The initial position is set at a position higher than the height position of the communication hole 58, i.e., at a position where the region in which the detection liquid 61 exists includes the space connection part, preferably at a position sufficiently higher than the height position of the communication hole 58. In FIG. 6 to FIG. 8, numerous minute dots are given to the region where the detection liquid 61 exists.

The detection gas 62 expands and contracts in the longitudinal direction (vertically in this embodiment) of the detection space so as to allow the position of the interface 64 to change vertically. As will be described later, the fluctuation of the interface 64 is caused in response to the pressure fluctuation, at the channel connection part, of the processing object fluid flowing in the reaction channel.

Respective substances that composes the detection liquid 61 and the detection gas 62 are selected according to the properties and/or the use conditions of the processing object fluid caused to flow through the reaction channel as a fluid channel. Specifically, the detection liquid 61 is preferably made of a substance incapable of reacting with the processing object fluid because the detection liquid 61 makes contact with the processing object fluid and, in some cases, a part of the detection liquid 61 flows out into the reaction channel. Besides, since the detection gas 62 is to make contact with the detection liquid 61 to form the interface 64 between the detection gas 62 and the detection liquid 61, respective substances of the detection liquid 61 and the detection gas 62 are preferably selected also to prevent them from reacting with each other. In general, in the case where air can be used as the detection gas 62, the use of the air allows the cost of the device to be reduced. In the case where oxygen contained in air affects properties and condition of the detection liquid 61, the detection gas 62 is preferably made of nitrogen gas or other inert gas.

3) Interface Position Detector

The interface position detector optically detects the position of the interface 64. Specifically, the light emitting device 71 is attached to the lower end surface of the channel forming body 10 so as to seal the lower opening of each of the detection spaces, and emits a measurement light beam, in each of the detection spaces, upward along the longitudinal direction of the detection space (vertically in this embodiment) as indicated by arrows shown in FIG. 7 and FIG. 8. The light receiving device 72 is attached to the upper end surface of the channel forming body 10 so as to seal the upper opening of each detection space, while including a plurality of light receiving elements corresponding to the plurality of detection spaces. Each of the light receiving elements receives only a light beam that is included in respective measurement light beams emitted to the detection space corresponding to the light receiving element and has been transmitted through the detection liquid 61 and the detection gas 62, and generates and outputs a detection signal that is an electric signal corresponding to the intensity of the light beam. Since the intensity of the light beam received by the light receiving element depends on the ratio of respective lengths of regions where the detection liquid 61 and the detection gas 62 exist, respectively, in the detection space corresponding to the light receiving element, the height position of the interface 64 in each of the detection spaces can be determined based on the detection signal output from each light receiving element.

The micro-channel reactor allows the presence/absence of a flow error in each of the reaction channels (fluid channels) to be detected as follows.

First, in the state where a processing object fluid normally flows through each of the reaction channels, the pressure of each processing object fluid flowing through each of the plurality of reaction channels is kept a normal pressure, the reaction channels being defined by the reaction-channel forming grooves 21 to 25 in each of the first to third downward channel sections C1 to C3. The position of the interface 64 between the detection liquid 61 and the detection gas 62 is, therefore, retained at the initial position as shown in FIG. 7 in each of the plurality of detection spaces corresponding to the plurality of reaction channels. The light receiving device 72 outputs a detection signal corresponding to the initial position.

In contrast, when partial occlusion or full occlusion occurs in any reaction channel in any of the first to third downward channel sections C1 to C3, the pressure of a processing object fluid downstream of the closure is reduced. The pressure drop of the processing object fluid causes a part of the detection liquid 61 contained in the detection space corresponding to the reaction channel where the occlusion occures to flow out into the reaction channel, lowering the position of the interface 64 between the detection liquid 61 and the detection gas 62 to such a position that the reduced pressure and the height of the detection liquid 61 in the detection space correspond to each other. For example, when occlusion occurs in a certain reaction channel at the position on the downstream side (in this embodiment, the lower side) of the communication hole 58 in the second downward channel section C2, the reaction channel being formed by the reaction-channel forming groove 24, the pressure of a processing object fluid downstream of the occlusion is reduced, in accordance with the degree of the occlusion, to be lower than that in a normal state. This causes, as shown in FIG. 8, the position of the interface 64 between the detection liquid 61 and the detection gas 62 in the detection space formed by the detection-space forming groove 54 corresponding to the reaction-channel forming groove 24, in the third detection region F3 corresponding to the third downward channel section C3, to be lowered from the initial position. In response to the lowering of the position of the interface 64, the detection signal output from the light receiving device 72 is also changed.

Hence, according to the micro-channel reactor, monitoring a plurality of detection signals that are output corresponding to the plurality of detection spaces enables a reaction channel where a flow error occurs to be specified. Specifically, when the change in any of the detection signals from the initial state becomes a fixed or greater change, i.e., when the difference between the predetermined initial position as the position of the interface 64 and the detected interface position exceeds an allowable range, it can be determined that a flow error exists in the reaction channel corresponding to the interface 64.

A second embodiment of the present invention will be described with reference to FIG. 10 to FIG. 18.

In the micro-channel reactor according to the first embodiment, the direct contact of the processing object fluid flowing through the reaction channel with the detection liquid 61 restricts the substance forming the detection liquid 61 to a substance incapable of affecting properties and condition of the processing object fluid. In contrast, the micro-channel reactor according to the second embodiment includes means for separating the processing object fluid and the detection liquid 61 to hinder them from direct contact with each other, thereby enhancing freedom of choosing the substance to form the detection liquid 61.

The separation means includes a plurality of separation spaces, and a separation gas 66 contained in each of the plurality of separation spaces, specifically as follows.

The plurality of separation spaces are interposed between the plurality of reaction channels and the detection spaces corresponding to the reaction channels, respectively, being in communication with the fluid channels and the detection spaces. The plurality of separation spaces are formed by the channel forming body 10 the same as the reaction channel and the detection space.

Figure 9:
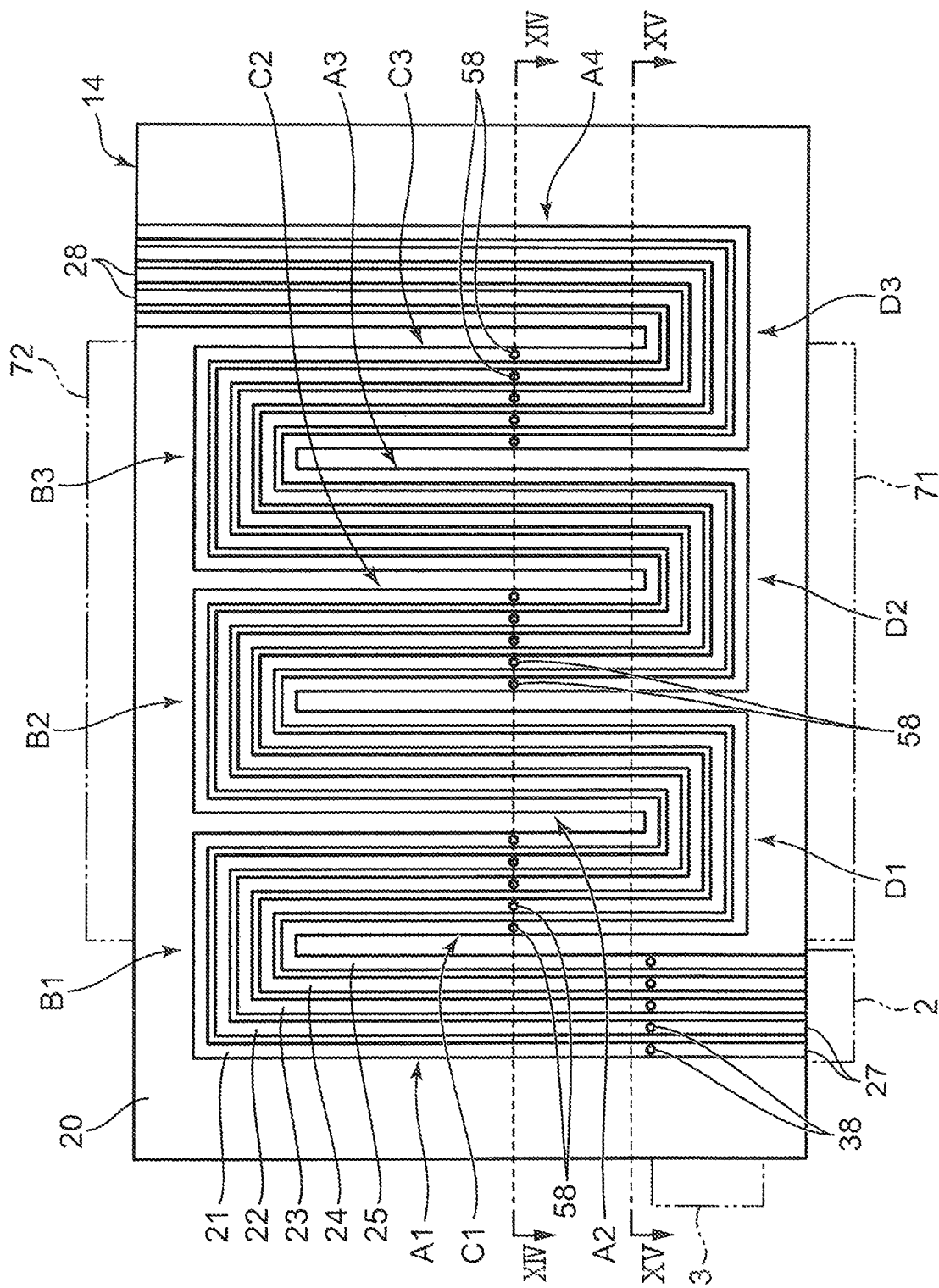
FIG. 9 is a front view of a channel forming plate configuring a micro-channel reactor as a fluid flow device according to a second embodiment of the present invention.
Figure 10:
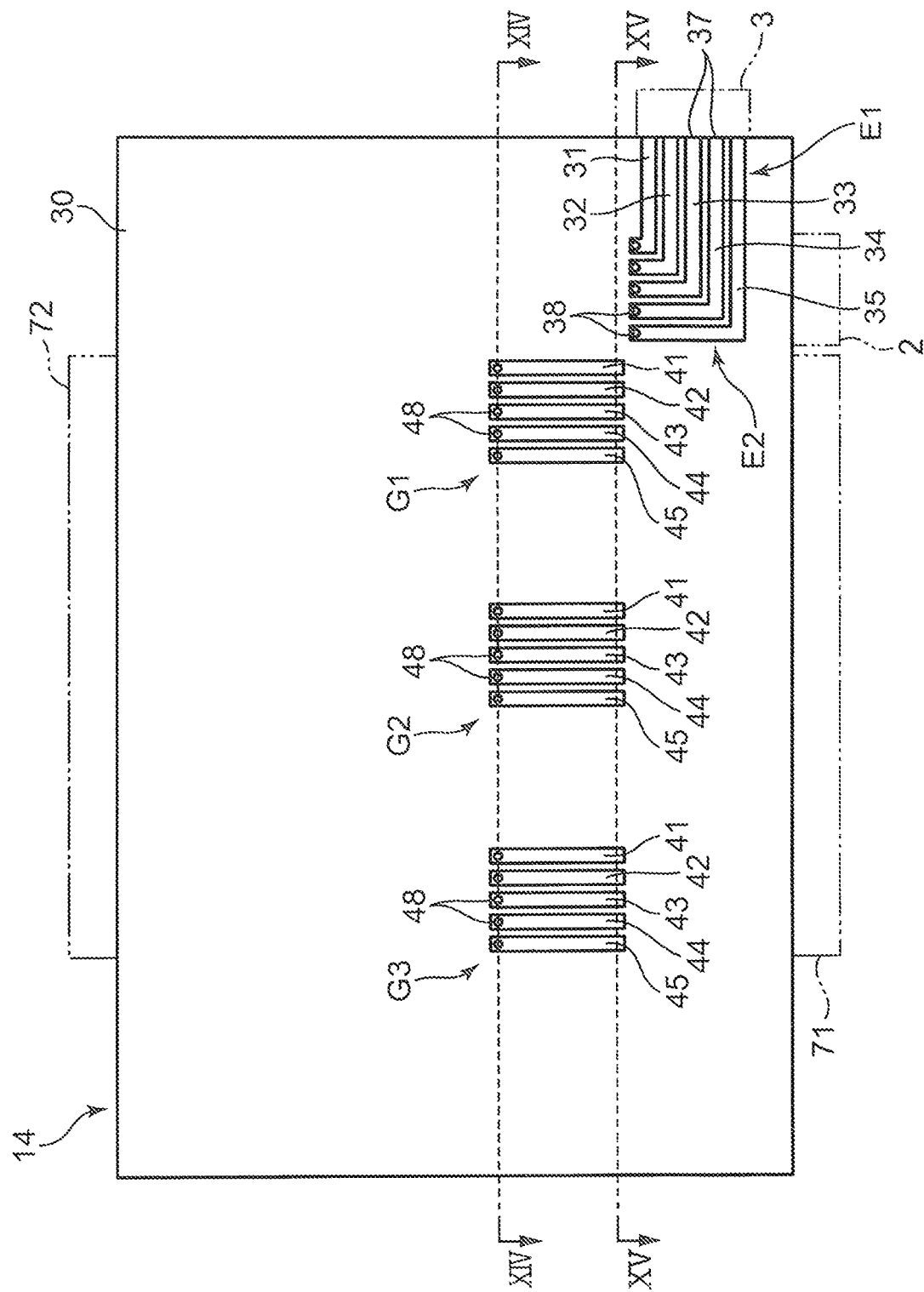
FIG. 10 is a back view of the channel forming plate shown in FIG. 9.
Figure 11:
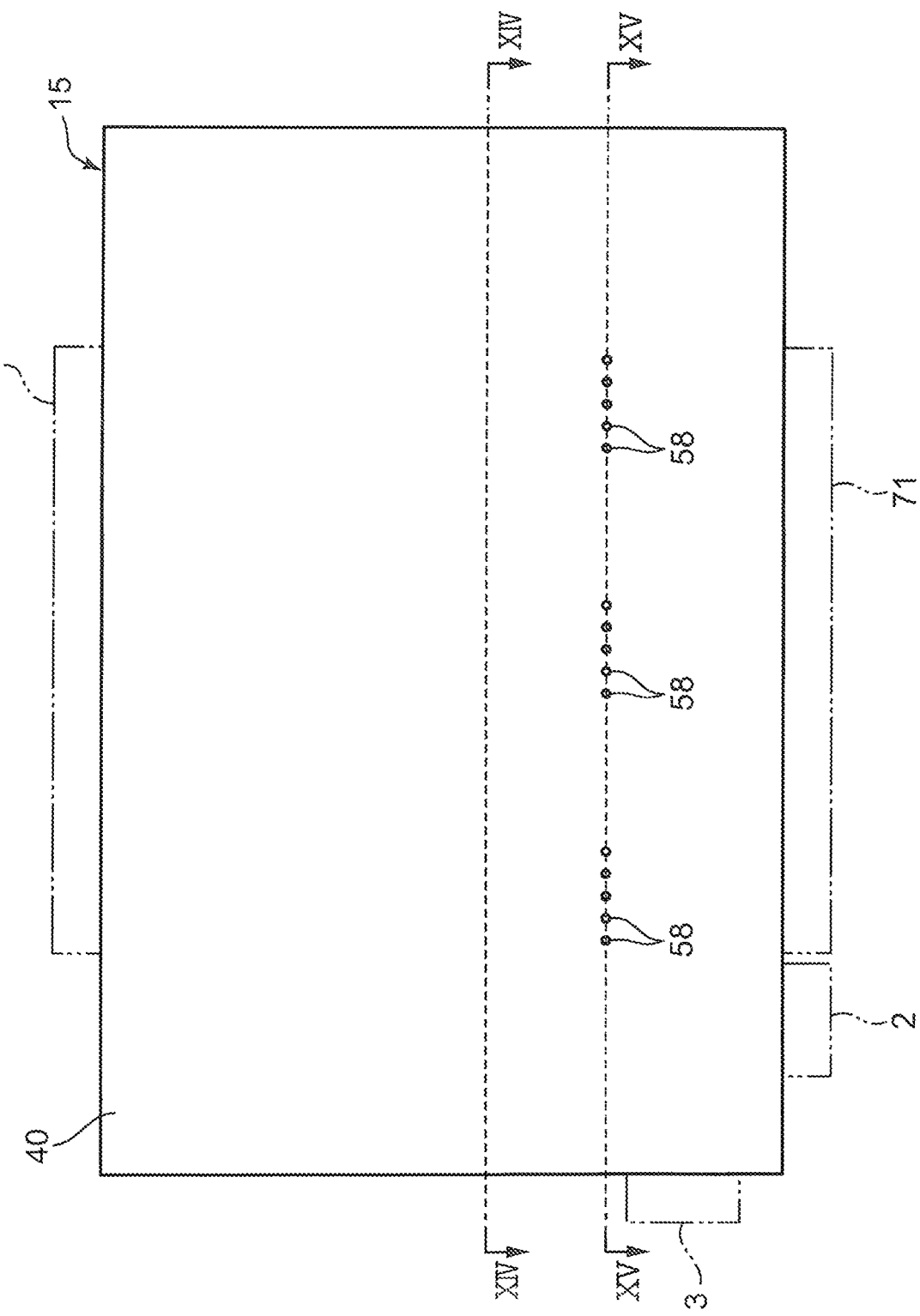
FIG. 11 is a front view showing a detection-space forming plate which configures the micro-channel reactor shown in FIG. 9
Figure 12:
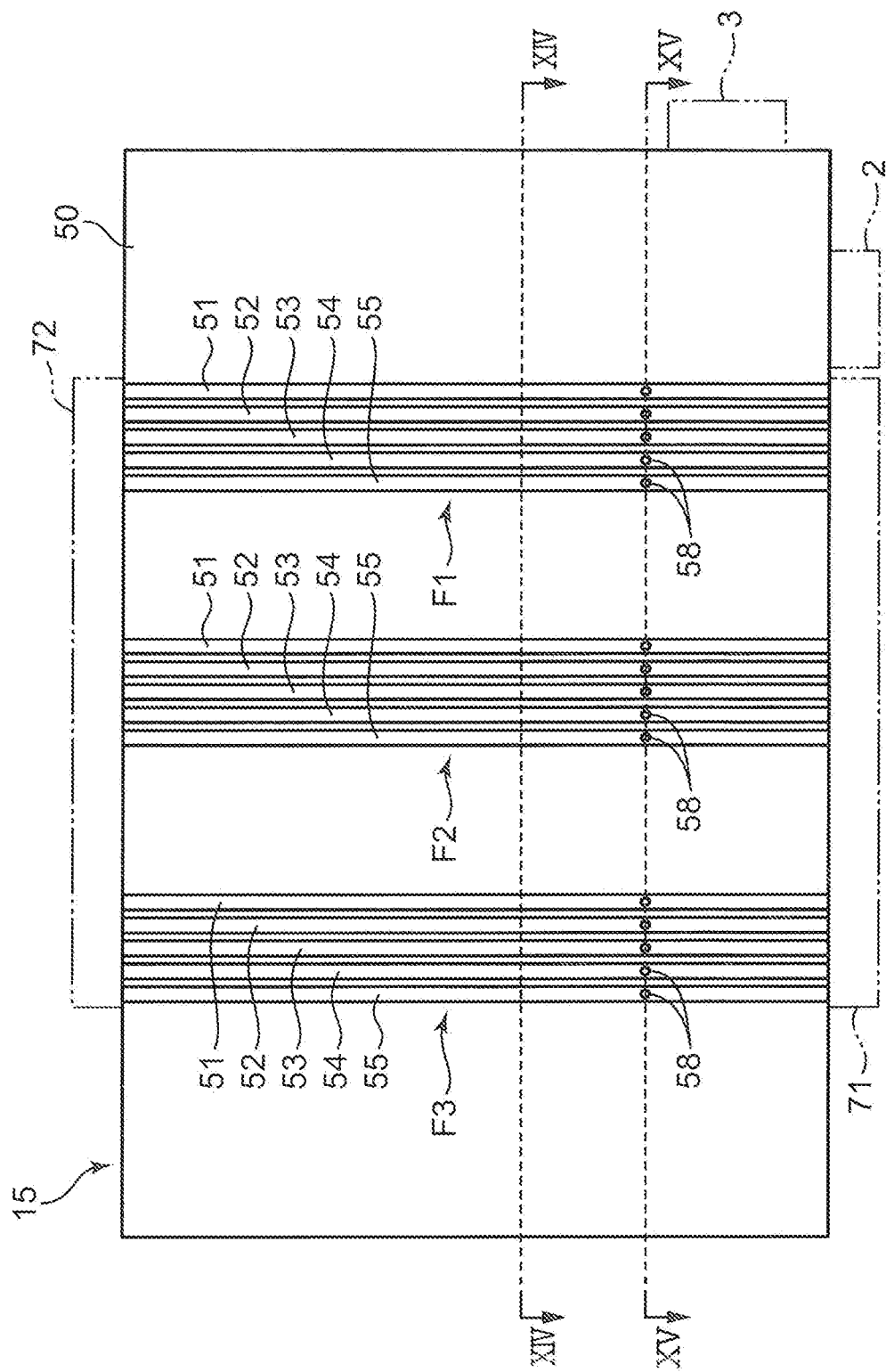
FIG. 12 is a back view of the channel forming plate shown in FIG. 11.
Figure 13:
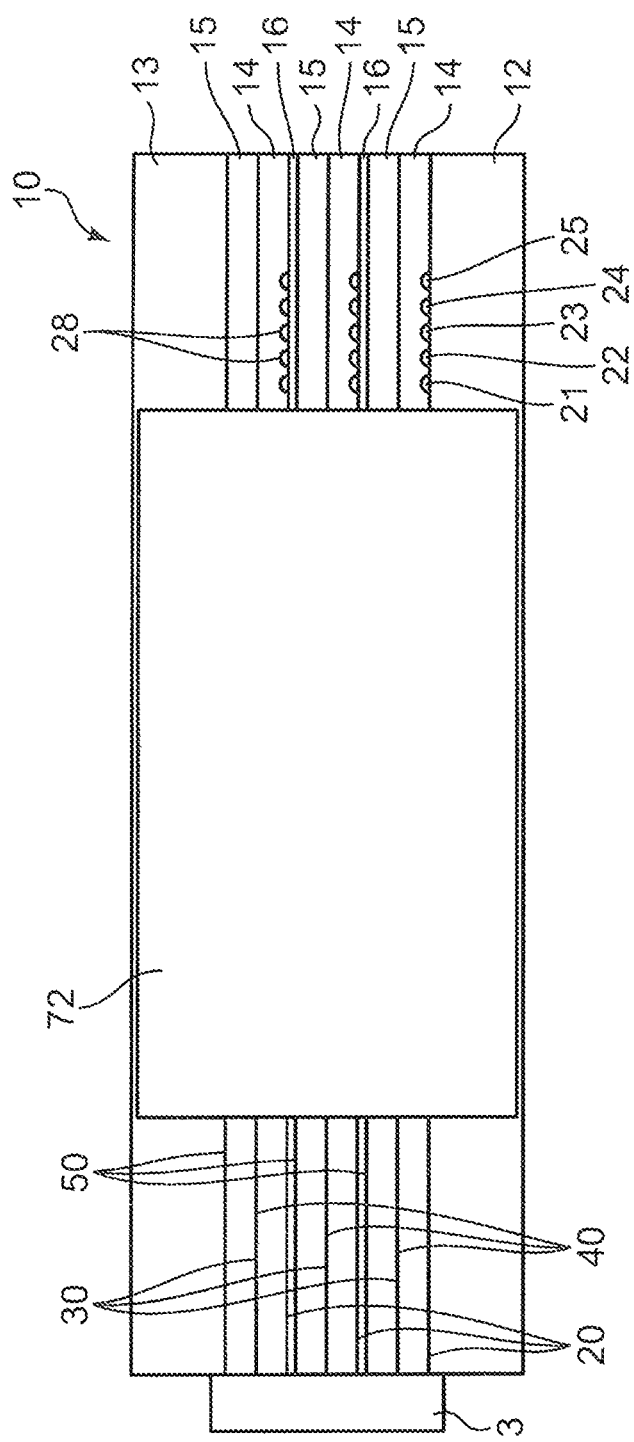
FIG. 13 is a plan view of the micro-channel reactor shown in FIG. 9.
Figure 14:
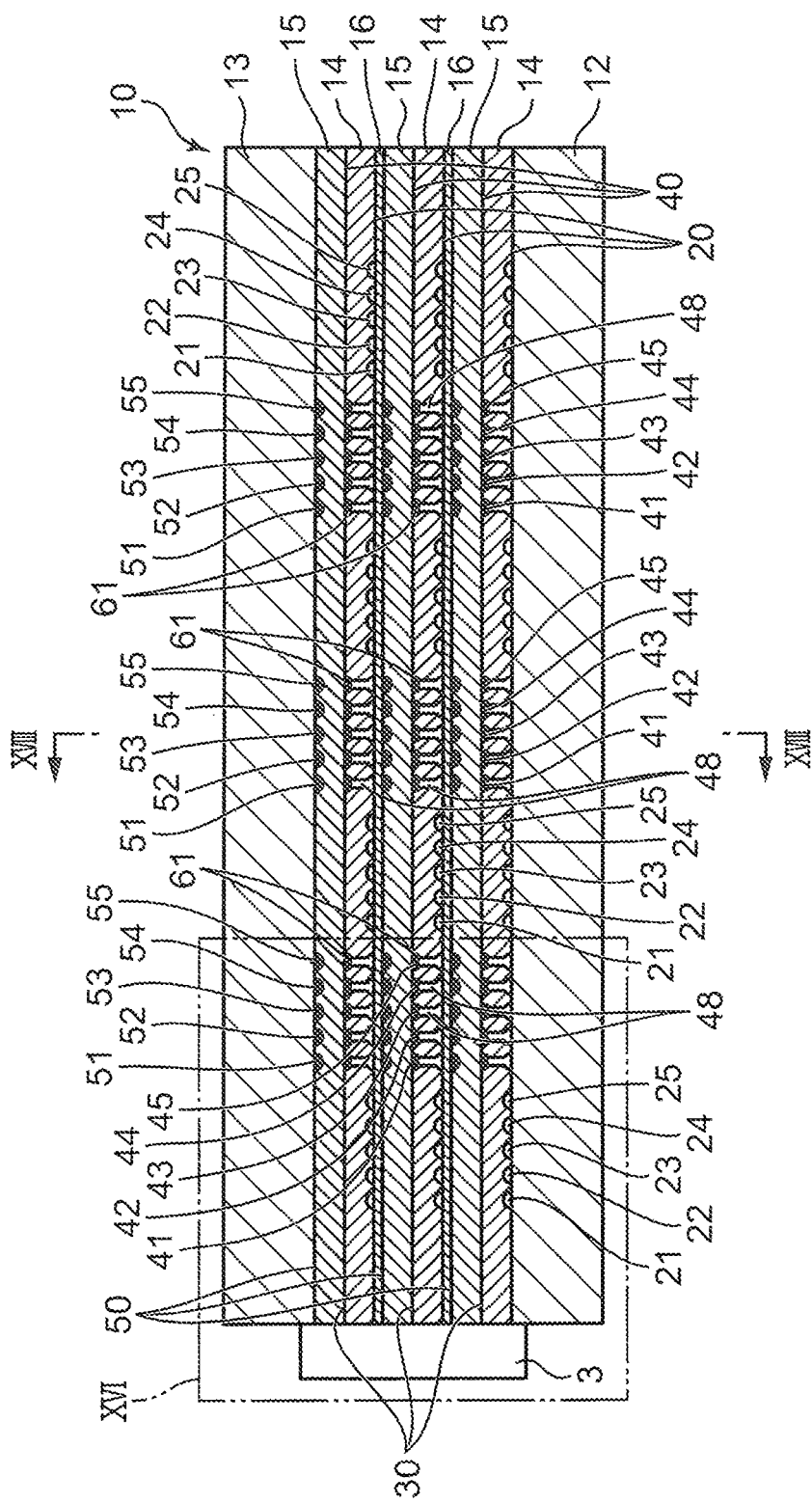
FIG. 14 is a plan view showing a cross-section of the micro-channel reactor shown in FIG. 9, the view showing a cross-section taken at a height corresponding to line XIV-XIV shown in FIG. 9 to FIG. 12.
Figure 15:
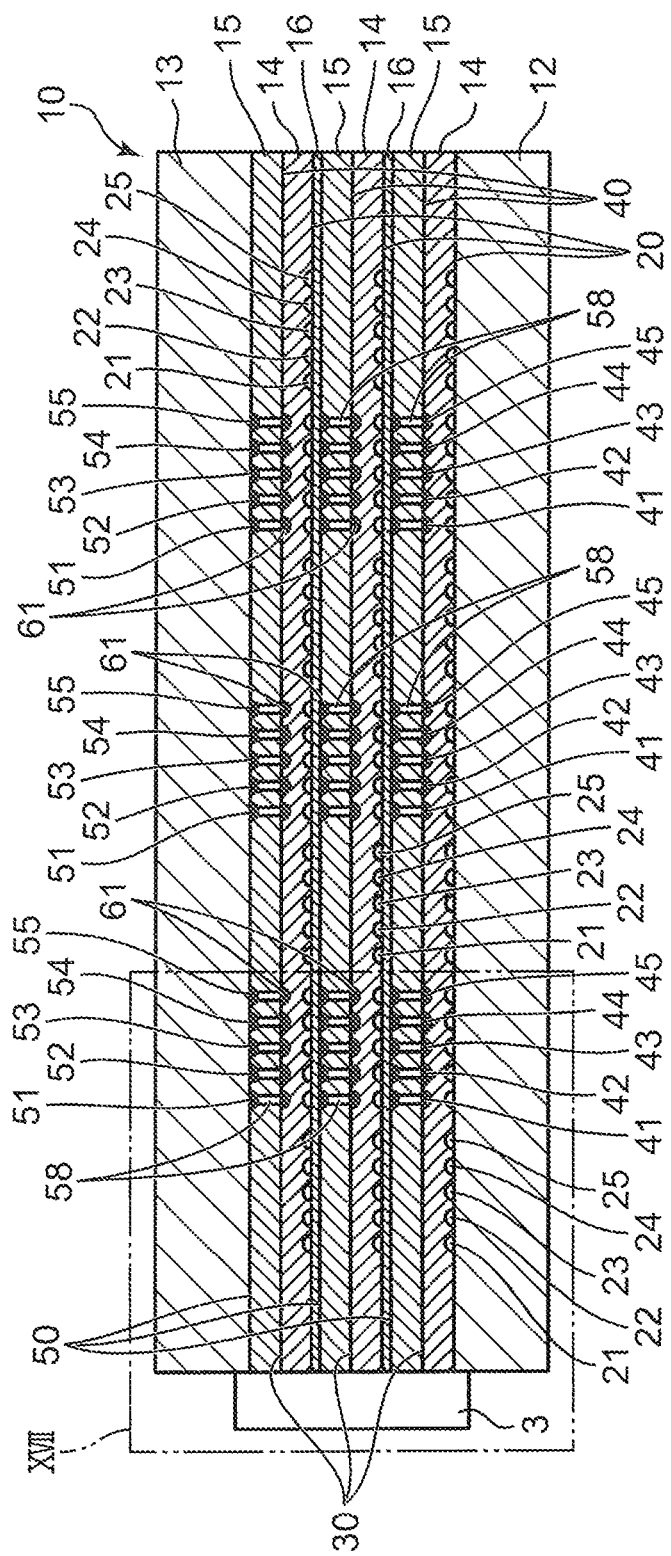
FIG. 15 is a plan view showing a cross-section of the micro-channel reactor shown in FIG. 9, the view showing a cross-section taken at a height corresponding to line XV-XV shown in FIG. 9 to FIG. 12.
Figure 16:
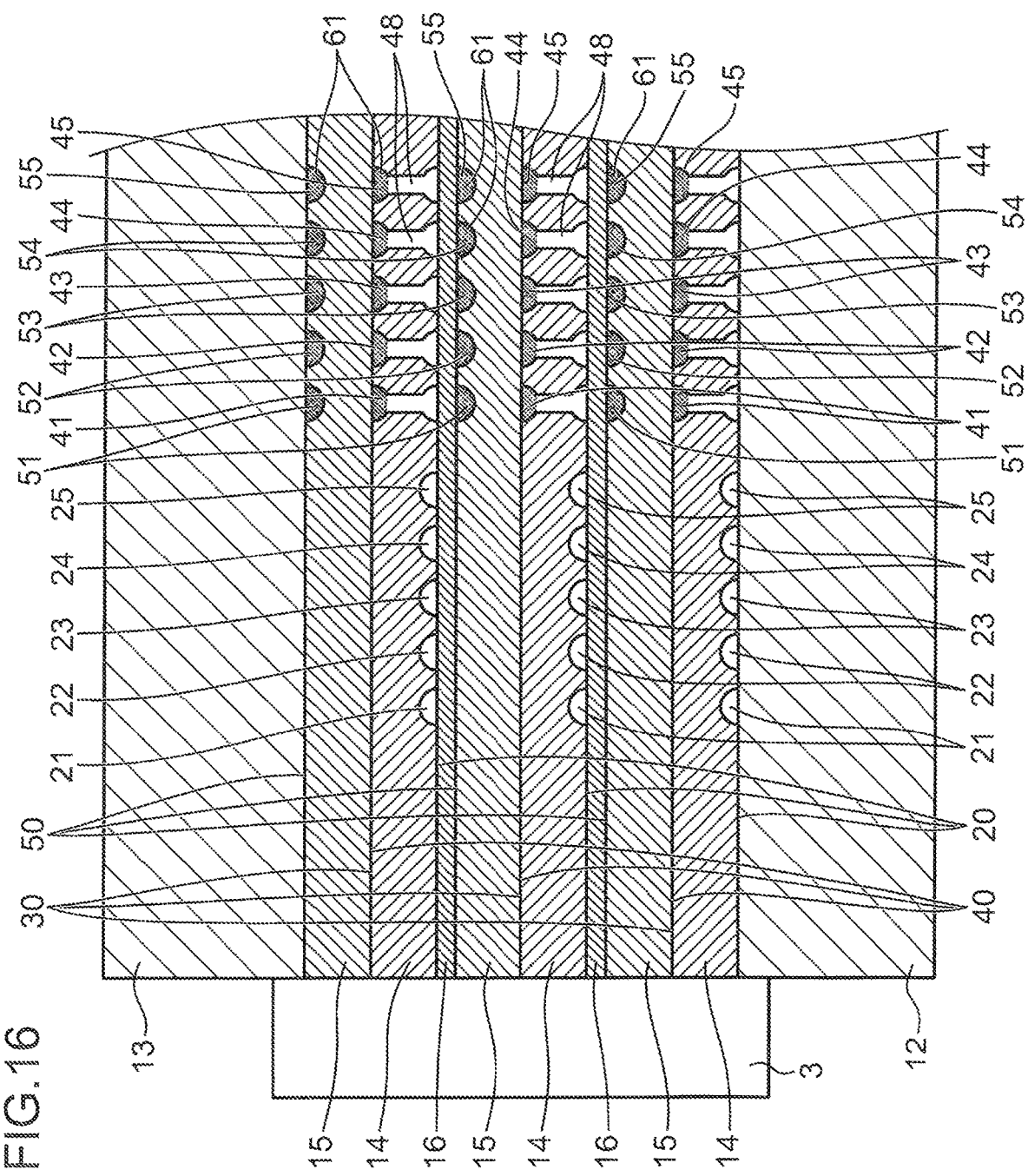
FIG. 16 is a sectional plan view showing, in an enlarged manner, a part surrounded by line XVI in FIG. 14.
Figure 17:
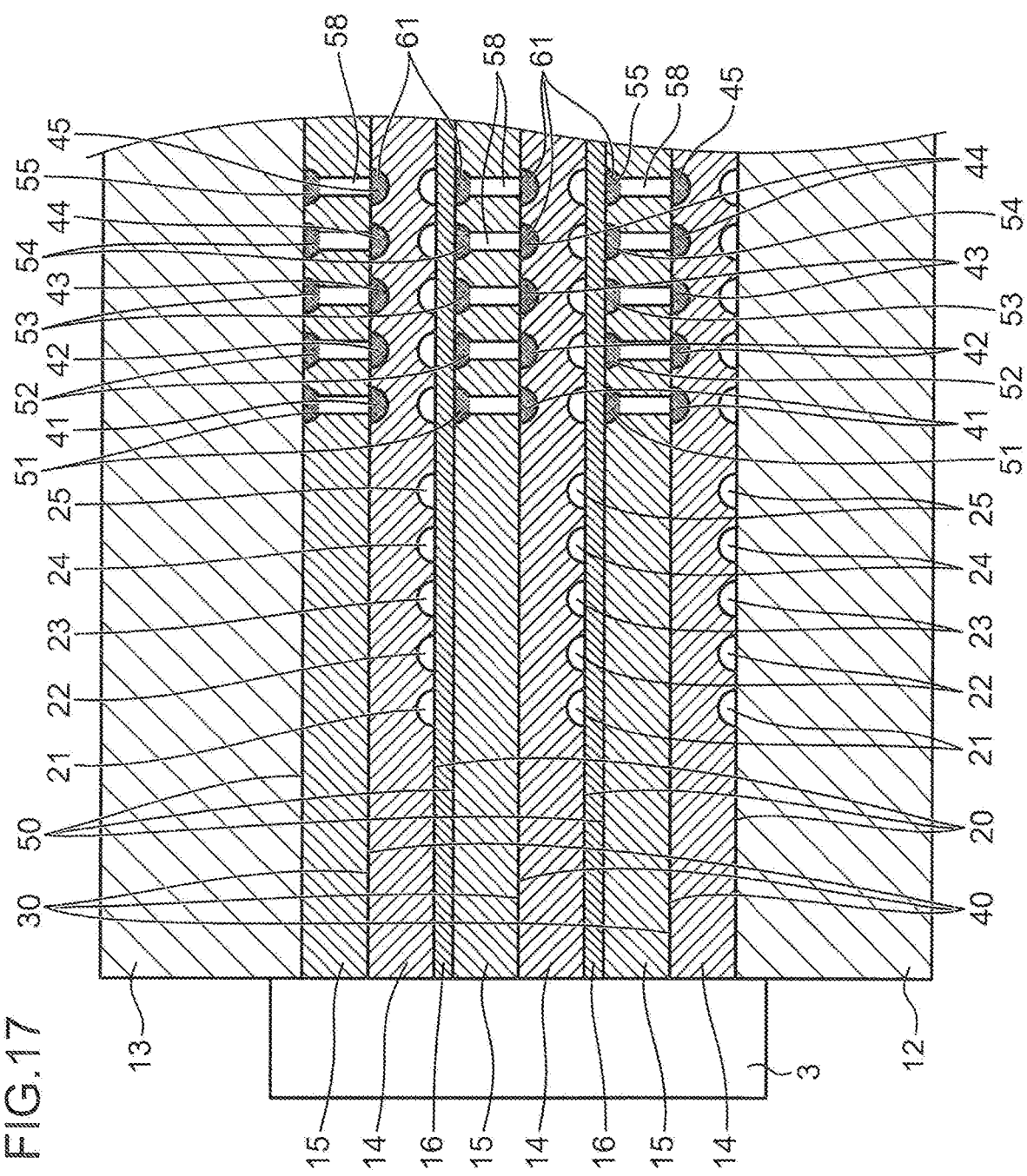
FIG. 17 is sectional plan view showing, in an enlarged manner, a part surrounded by line XVII in FIG. 15.

Specifically, in place of the plurality of channel forming plates 11 according to the first embodiment, the channel forming body 10 according to the second embodiment includes a plurality of pairs, each of which pairs is composed of a channel forming plate 14 and a space-forming plate 15 laminated together. The channel forming plate 14 has a front side surface 20 shown in FIG. 9 and a back side surface 30 shown in FIG. 10, similarly to the channel forming plate 14 according to the first embodiment. The space-forming plate 15 has a front side surface 40 shown in FIG. 11 and a back side surface 50 that is opposite to the front side surface and shown in FIG. 12. The both plates 14 and 15 overlap each other so as to bring the back side surface 30 of the channel forming plate 14 and the front side surface 40 of the space-forming plate 15 into close contact with each other. Similarly to the first embodiment, a partition plate 16 is interposed between the back side surface 50 of the space-forming plate 15 and the front side surface 20 of the channel forming plate 14 adjacent to the space-forming plate, and, on both outer sides in the thickness direction of the plates, a front side outer plate 12 and a back side outer plate 13 are disposed, respectively.

Similarly to the channel forming plate 14 according to the first embodiment, the front side surface 20 of the channel forming plate 14 is formed with reaction-channel forming grooves 21 to 25 which define a plurality (five in this embodiment) of reaction channels in collaboration with the partition plate 16 or a back side surface of the front side outer plate 12, and the back side surface 30 is formed with introduction-channel forming grooves 31 to 35 which define (second fluid) introduction channels corresponding to the plurality of reaction channels in collaboration with the front side surface 40 of the space-forming plate 15.

Differently from the first embodiment, the back side surface 30 of the reaction channel 14 according to the second embodiment is formed with not detection-space forming grooves 51 to 55 but a plurality (five in this embodiment) of separation-space forming grooves 41, 42, 43, 44, and 45 located in each of a first separation region G1, a second separation region G2, and a third separation region G3, and a plurality of communication holes 48 corresponding to respective separation-space forming grooves 51 to 55. The detection-space forming grooves 51 to 55 are formed not in the channel forming plate 14 but in the back side surface 50 of the space-forming plate 15.

The first to third separation regions G1 to G3 are respective regions corresponding to first to third downward channel sections C1 to C3 with respect to the reaction-channel forming grooves 21 to 25. In each of the separation regions, the separation-space forming grooves 41 to 45 extend vertically, at a position exactly opposite to the reaction-channel forming grooves 21 to 25 in the first to third downward channel sections C1 to C3, along the reaction-channel forming grooves 21 to 25. The separation-space forming grooves 41 to 45 preferably have the same widths as those of the reaction-channel forming grooves 41 to 45, respectively.

Figure 18:
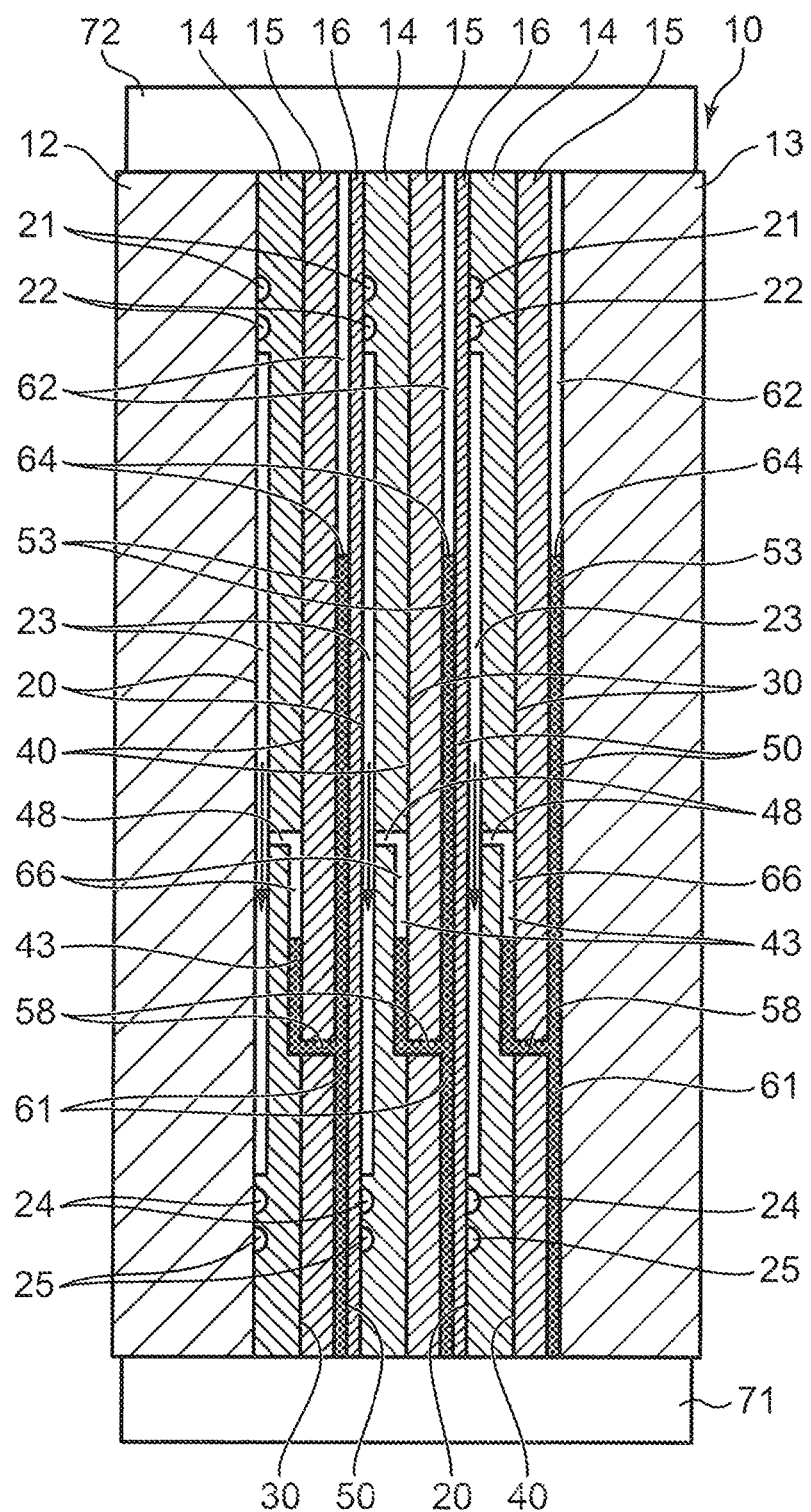
FIG. 18 is a side view showing a cross-section taken along line XVIII-XVIII in FIG. 9.

The separation-space forming grooves 41 to 45 define detection spaces having the same shape as those of the separation-space forming grooves 41 to 45, in collaboration with the front side surface 40 of the space-forming plate 15 making close contact with the back side surface 30. As shown in FIG. 18 which representatively shows the separation-space forming groove 43, respective lower ends of the separation-space forming grooves 41 to 45 are sealed ends which are sealed at respective positions higher than those of lower ends of the corresponding reaction-channel forming grooves 21 to 25. Similarly, respective upper ends of the separation-space forming grooves 41 to 45 are sealed ends which are sealed at respective positions lower than upper ends of the corresponding reaction-channel forming grooves 21 to 25.

The plurality of communication holes 48 pass through the channel forming plate 14 in the plate thickness direction thereof from respective bottom portions of the upper ends of the separation-space forming grooves 41 to 45 to respective bottom portions of the reaction-channel forming grooves 21 to 25, at the same height position as the upper ends, thereby providing communication between the reaction channel and the corresponding separation space.

The front side surface 40 of the space-forming plate 15 is formed with no groove, functioning mainly as a definition surface. Specifically, the front side surface 40 makes close contact with the back side surface 30 of the channel forming plate 14, thereby defining a plurality of introduction channels in collaboration with the introduction-channel forming grooves 31 to 35 and defining a plurality of separation spaces in collaboration with the separation-space forming grooves 41 to 45.

In the back side surface 50 of the space-forming plate 15, the detection-space forming grooves 51 to 55 and a plurality of communication holes 58 are formed in each of first to third detection regions F1 to F3 similarly to the back side surface 30 of the channel forming plate 11 according to the first embodiment. The first to third detection regions F1 to F3 correspond to the first to third downward channel sections C1 to C3, respectively, and further correspond to the first to third separation regions G1 to G3, respectively. The detection-space forming grooves 51 to 55 extend along the separation-space forming grooves 41 to 45. The plurality of communication holes 58 are formed at the same height position as respective height positions of the lower ends of the separation-space forming grooves 41 to 45, and pass through the space-forming plate 15 in the plate thickness direction thereof so as to provide communication between the lower ends and the detection-space forming grooves 51 to 55.

The respective communication holes 58 according to the embodiment, thus, constitute communication channels which provide communication between the reaction channels and the corresponding detection spaces, in cooperation with the corresponding separation spaces and communication holes 48. In other words, the communication channel according to the embodiment includes a separation space interposed between the reaction channel and the detection space.

The detection liquid 61 has entered not only the detection space but also the separation space through the communication hole 58. As shown in FIG. 18, the separation gas 66 is contained in the separation space so as to be interposed between the upper surface of the detection liquid 61 in the separation space and a processing object fluid flowing through the reaction channel, thereby hindering the detection liquid 61 and the processing object fluid from direct contact with each other. The separation gas 66 only has to be incapable of affecting either the processing object fluid or the detection liquid 61. Under this condition, selected is as the separation gas 66 is air, inert gas, or other gas.

The present invention is not limited to the foregoing descried embodiments, specifically as follows.

A) Processing Target Fluid

The processing object fluid according to the present invention is not limited to one to be reacted, such as the first and second fluids. In other words, the fluid flow device according to the present invention is not limited to a micro-channel reactor, hence, the fluid channel thereof being not limited to the reaction channel. The processing object fluid may be, for example, either a fluid to be subject to another chemical operation such as extraction or a fluid to be heated or cooled through heat exchange with a heat medium. In other words, the fluid flow device according to the present invention may be, for example, either an extraction device which forms a fluid channel for extraction operation or a heat exchanger which forms a channel for bringing a processing object fluid and a heat medium to heat or cool the processing object fluid into heat exchange with each other.

B) Detection of Interface Position

The feature of the present invention is to convert the pressure change due to a flow error in a fluid channel into the change in the position of an interface between a detection liquid and a detection gas to thereby enhance freedom of choice of means for detecting a flow error (i.e. eliminating the limitation of the means to a pressure detector). The specific means for detecting the position of the interface, therefore, is allowed to be freely set, being not necessarily limited to one that optically detects the position of the interface.

Figure 19:
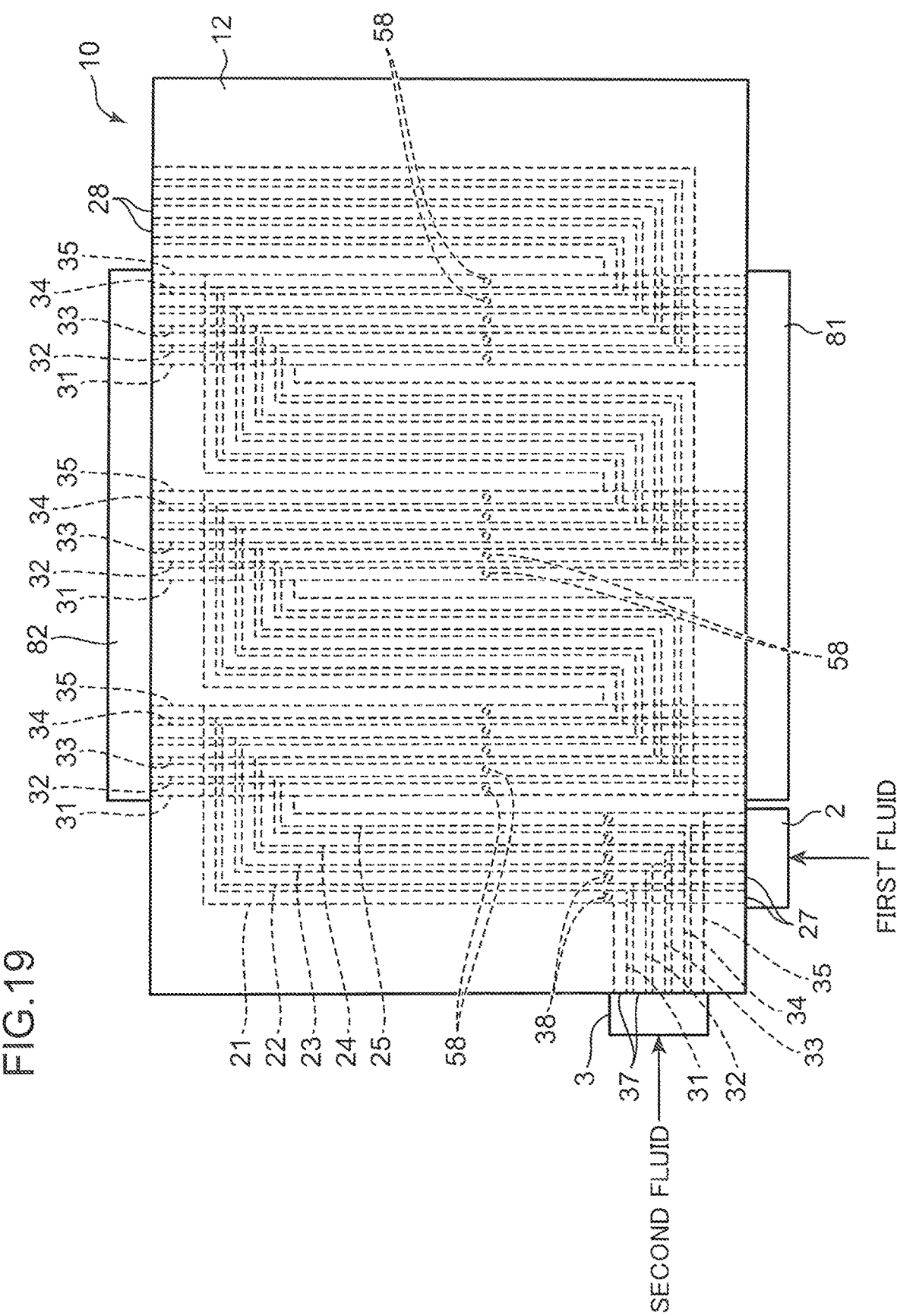
FIG. 19 is a front view of a micro-channel reactor as a fluid flow device according to a third embodiment of the present invention.
Figure 20:
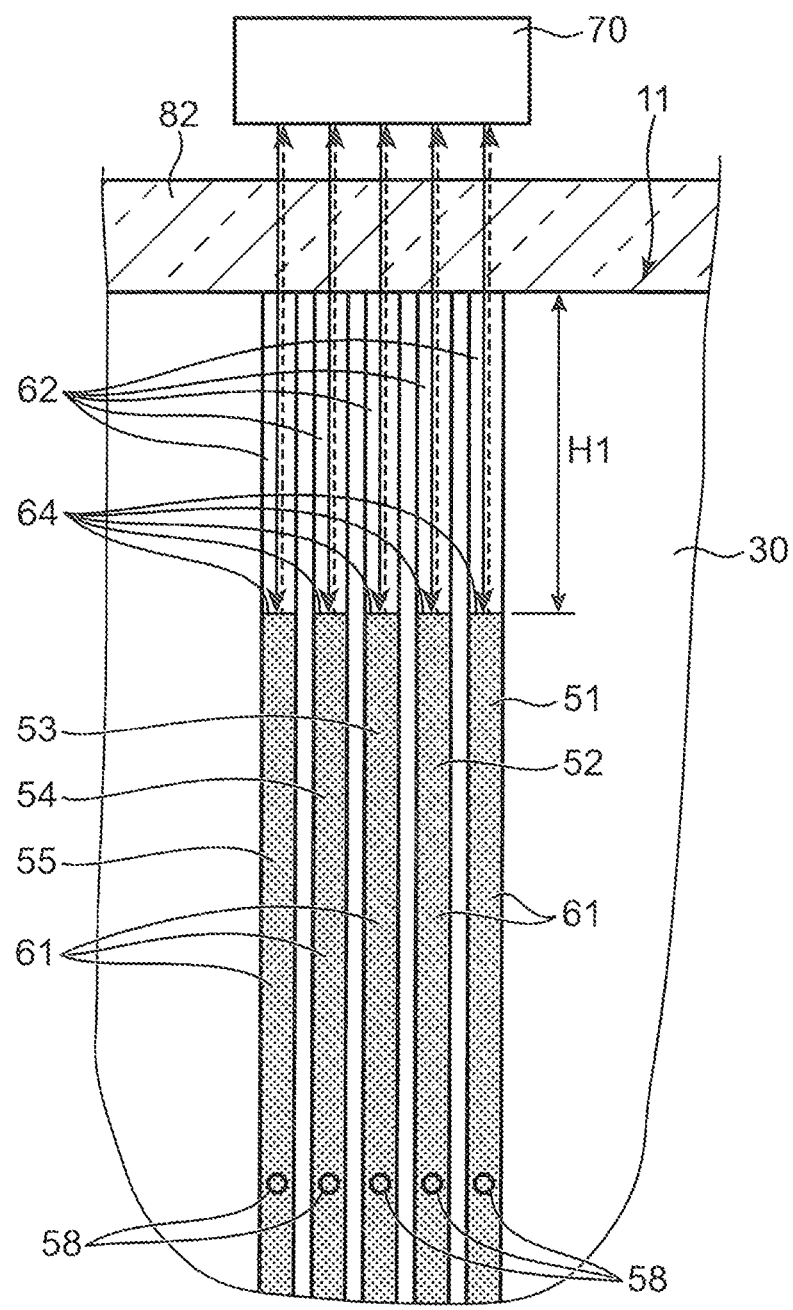
FIG. 20 is a back view showing an interface between a detection liquid and a detection gas in each detection space when a flow state of each reaction channel in the micro-channel reactor shown in FIG. 19 is normal.
Figure 21:
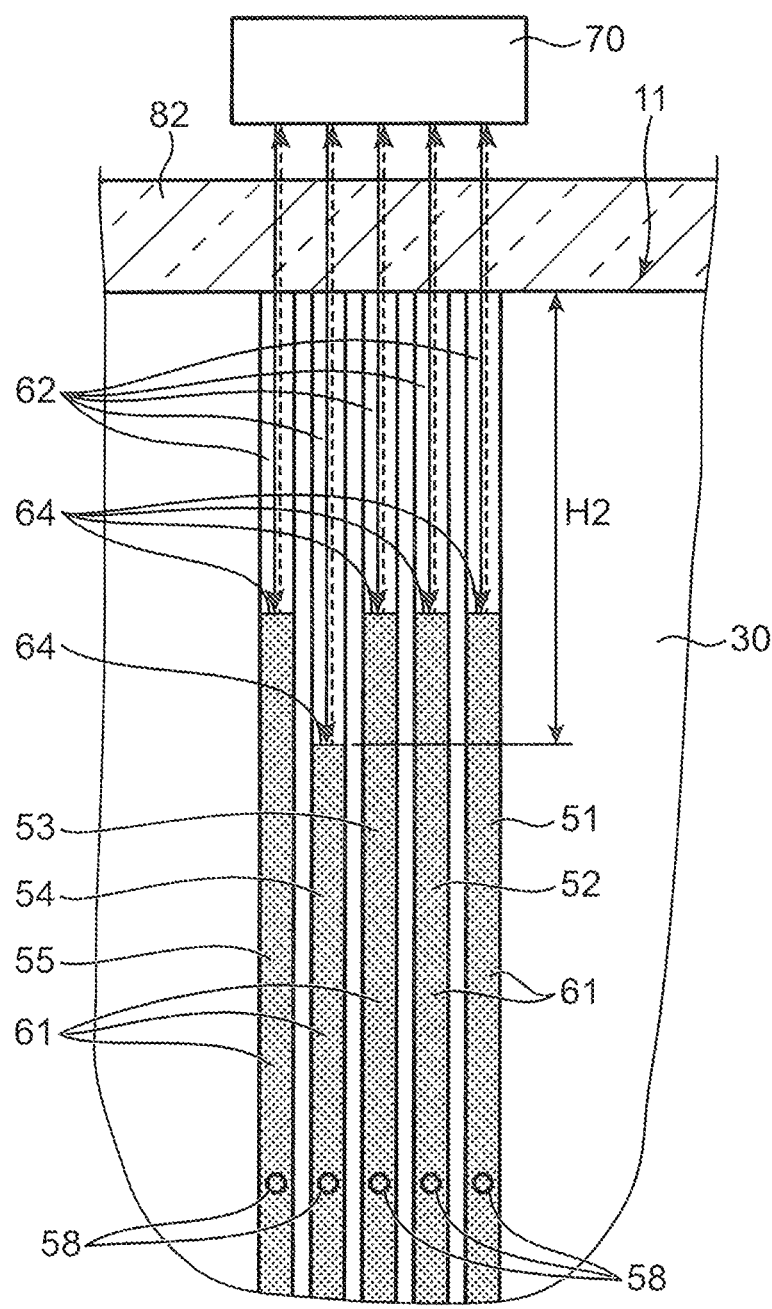
FIG. 21 is a back view showing an interface between a detection liquid and a detection gas in each detection space when a flow state of a part of the reaction channels in the micro-channel reactor shown in FIG. 19 involves an error.

Besides, the fluid flow device according to the present invention do not necessarily have to include an interface position detector; it is also possible to use a detector independent of the fluid flow device in order to detect an interface position in the fluid flow device. FIG. 19 to FIG. 21 show a micro-channel reactor according to a third embodiment as one example thereof. While the micro-channel reactor includes a channel forming body 10 similarly to the first embodiment, the channel forming body 10 includes an upper sealing plate 81 and a lower sealing plate 82 as respective parts to seal an upper end opening and a lower end opening of each of the detection spaces in place of the light emitting device 71 and the light receiving device 72. At least one of the upper sealing plate 81 and the lower sealing plate 82 (the upper sealing plate 81 in the mode shown in FIG. 19 to FIG. 21) has light transmittancy that allows light to be transmitted from the outside of the channel forming body 10 to the end of the detection space (the upper end in FIG. 19 to FIG. 21).

The light transmittancy makes it easy to detect the position of the interface 64 optically through emitting a measurement light beam into the detection space from the outside of the channel forming body 10. FIG. 20 and FIG. 21 show an example of detecting the position of the interface 64 with a general-purpose position detector 70 independent of the micro-channel reactor with utilization of the light transmittancy. The position detector 70 includes both a light emitting element and a light receiving element. The light emitting element is able to emit a measurement light beam to the interface 64 between the detection gas 62 and a detection liquid 61, through the upper sealing plate 81 and a detection gas 62 in a detection space below the upper sealing plate. The light receiving element receives only a light beam that is included in the measurement light beam and has been reflected by the interface 64 and generates an electric signal (detection signal) corresponding to intensity of the received light beam to output it. The detection signal output by the light receiving element, which corresponds to the length of the region occupied by the detection gas 62 in the detection space, enables the position of the interface 64 to be grasped based on the detection signal.

The thus reflective position detector 70 is able to be shared for a number of detection spaces, which drastically reduces costs of the device. For example, in the case where the position detector 70 includes five light receiving elements corresponding to five detection spaces existing in each of the detection regions F1 to F3, respectively, it is possible to provide the position detector 70 inside the upper sealing plate for each of the detection regions for detection. The position detector 70, alternatively, is also able to be integrally incorporated into a micro-channel reactor (or another fluid flow device) as a component thereof, similarly to the first embodiment. Besides, in the device where also the lower sealing plate 61 has light transmittancy similarly to the upper sealing plate 82, it is possible to emit upward emit the measurement light beam into the detection space similarly to the first and the second embodiments from below the lower sealing plate 61 through the lower sealing plate 61 and to let a light receiving device receive the light beam having passed through the detection liquid 61, through the upper sealing plate 62.

C) Initial Position of Interface

Respective initial positions of interfaces in the plurality of detection spaces do not have to be uniformed, being also permitted to be different from each other as shown in FIG. 7. Also in this case, it is possible to determine the presence of a flow error based on excess of the difference between an initial position set for each detection space and a detected interface position from an allowable range. Besides, in the case where the initial positions are uniformed as shown in FIG. 7, the presence of a flow error can be determined based on excess of the variation of the detected plurality of interface positions from an allowable range.

D) Arrangement and the Number of Channels and Detection Spaces

The arrangement and the number of a plurality of fluid channels and the corresponding plurality of detection spaces can be freely set. For example, the plurality of fluid channels and the plurality of detection spaces may intersect with each other, or the detection spaces may be adjacent to the plurality of fluid channels, respectively, in the same direction as a direction in which the fluid channel are aligned. In short, the fluid channels and the detection spaces may be aligned alternatively. However, such arrangement as in the first and second embodiments enables detection of flow of a processing object fluid and a flow error thereof to be realized with a compact structure, the arrangement being one in which the plurality of fluid channels extend parallel to each other on a first plane (a plane equivalent to the front side surface 20 of the channel forming plates 11 and 14 in the first and second embodiments) and the plurality of detection spaces extend along a second plane (a plane equivalent to the back side surface 30 of the channel forming plate 11 in the first embodiment and equivalent to the back side surface 50 of the space-forming plate 15 in the second embodiment) which extends along the first plane while being spaced in the direction of the normal line of the first plane.

The longitudinal direction of a fluid channel and a detection space is not required to be vertical. The longitudinal direction may be either horizontal or inclined.

While the regions where detection spaces are formed in each embodiment (first to third detection regions F1 to F3) are set to respective regions corresponding to the first to third downward channel sections C1 to C3, the place and the number of the regions can be freely set. For example, respective regions of the detection spaces can be respective regions corresponding to the first to fourth upward channel sections A1 to A4 or a region corresponding to an interconnection region. Besides, it is also possible that the detection space be formed only in a region corresponding to a downstream section in the fluid channels.

Furthermore, the shape and the position of the detection space can be freely set regardless of the specific shape of a fluid channel. For example, in the case of a curved fluid channel, the detection space may either be curved along the fluid channel or have a shape different from the fluid channel.

E) Separation Space

In the case where a separation space is formed, the shape and the position thereof can be freely set under the condition that the separation space is interposed between a fluid channel and a detection space corresponding thereto. For example, the separation space may have a shape extending in a direction different from the longitudinal direction of a fluid channel or different from the longitudinal direction of a detection space, or may have an approximately cubic shape. However, the arrangement as in the second embodiment has an advantage of hindering a processing object fluid and a detection liquid from direct contact with each other, with a compact structure, the arrangement being one in which a plurality of fluid channels extend in parallel to each other along a third plane (in the second embodiment, the back side surface 30 of the channel forming plate 14) interposed between the first plane and the second plane.

F) Structure of Channel-Forming Body

Specific structure of a channel forming body is not limited. The channel forming body may have, for example, a block-shape made of a signal member, or may form a fluid channel only in a single layer.

G) Seal of Detection Space

Regarding the detection space according to the present invention, the opposite ends thereof only has to include one sealed end, thus the other end not having to be necessarily sealed. For example, a part or all of the plurality of detection spaces of the fluid flow device according to the present invention may be an open space having one sealed end and an opened end opposite thereto.

Figure 22:
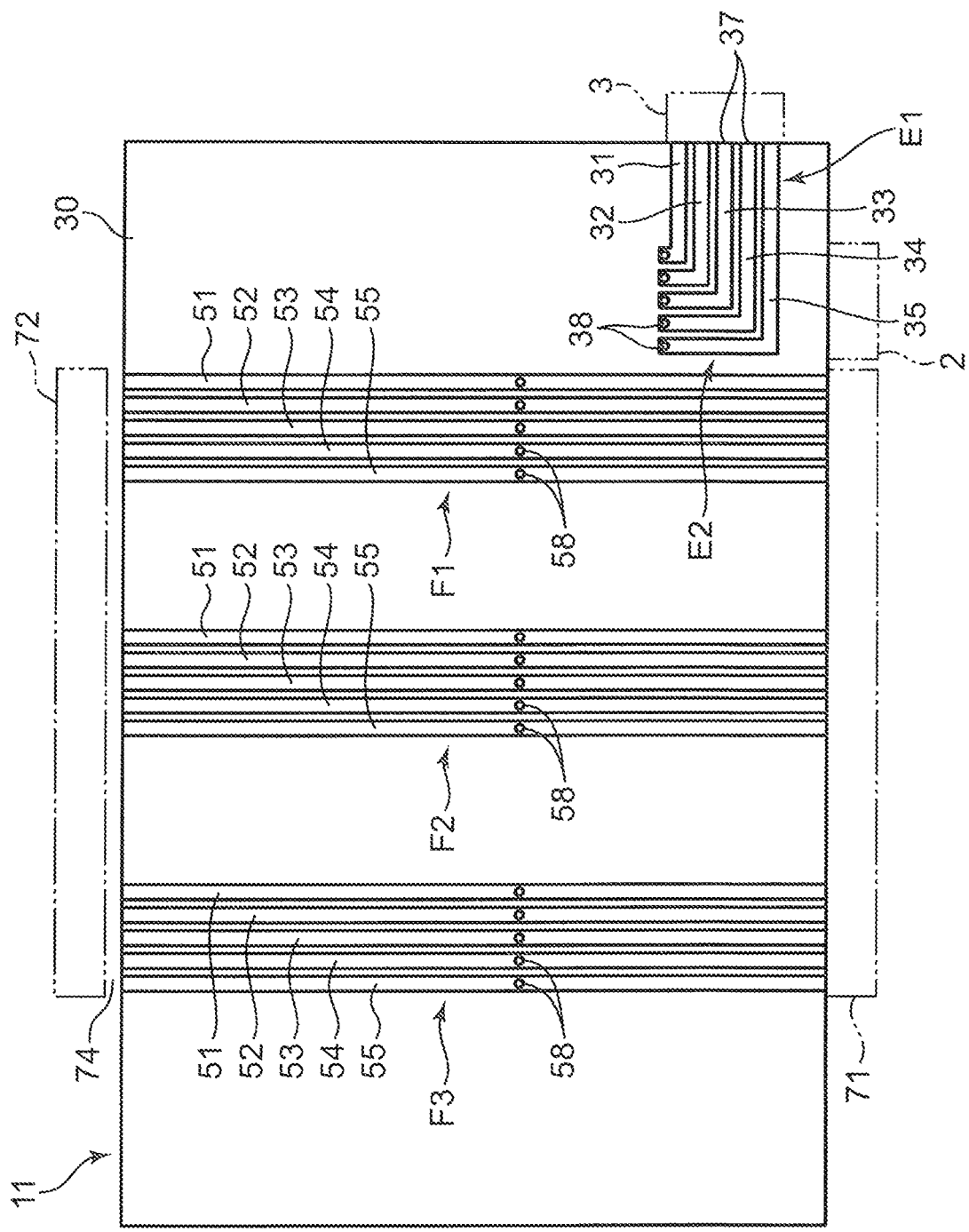
FIG. 22 is a back view of a channel forming plate of a micro-channel reactor as a fluid flow device according to a fourth embodiment of the present invention.

FIG. 22 shows a detection space of a micro-channel according to a fourth embodiment as one example. The micro-channel has a channel forming plate 11 similarly to the micro-channel according to the first embodiment. The channel forming plate has a back side surface 30 where a first detection region F1, a second detection region F2, and a third detection region F3 are set. In each of the first to third detection regions F1 to F3, a plurality (five also in this embodiment) of detection-space forming grooves 51, 52, 53, 54, and 55 are formed, and a plurality of communication holes 58 are formed correspondingly to the detection-space forming grooves 51 to 55, respectively. Respective lower ends of the detection-space forming grooves 51 to 55 are sealed by a light emitting device 71 similarly to the first embodiment, whereas respective upper ends thereof are opened to air. Specifically, a gap 74 is provided between the upper surface of a channel forming body 10, the upper end being opened in the upper surface, and a light receiving device 72, below which the upper ends of the detection-space forming grooves 51 to 55 are opened to the gap 74. Thus, detection spaces formed by the detection-space forming grooves 51 to 55 are open spaces having their respective lower ends that are sealed and have their respective upper ends that are opened.

Figure 23:
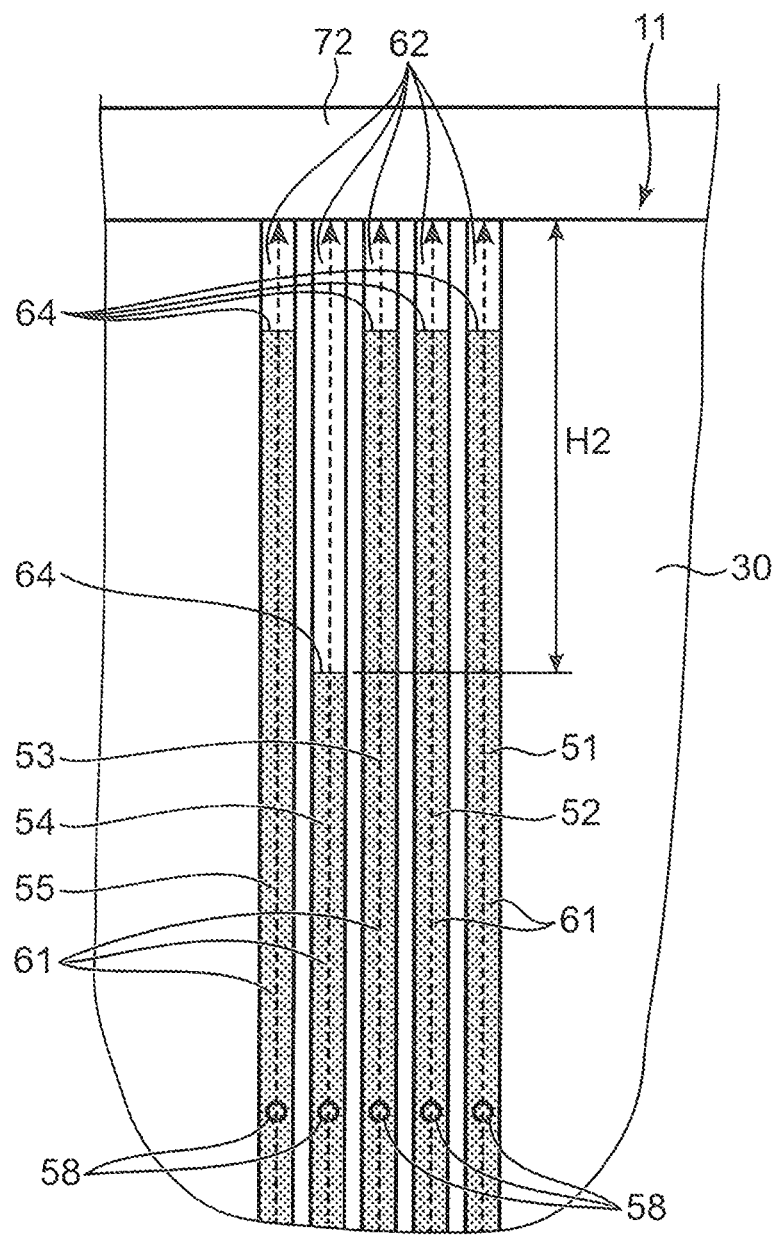
FIG. 23 is a back view showing an interface between a detection liquid and a detection gas in each detection space when a flow state of a part of the reaction channels in the micro-channel reactor shown in FIG. 22 involves an error.

As shown in FIG. 23, for example, the opened upper ends of the detection spaces enable the position of the interface 64 (the position of the interface 64 in the detection space formed by each of the detection-space forming grooves 51 to 53, and 55 in FIG. 23) when the corresponding reaction channel is normal to be located higher than the position of the interface 64 according to the first embodiment (the position shown in FIG. 8). This increases the difference between the position of the interface 64 in the normal state and the position of the interface 64 in a state involving an error to thereby allow distinguishing the positions from each other (i.e. judgment of normality/error) to be easily conducted.

The detection gas contained in the open space is preferably air. This allows the open space to be opened directly to air. In the case of using gas other than air, for example, nitrogen gas or other inert gas, as the detection gas, it is preferable that the entire fluid flow device is housed in a chamber filled with the inert gas.

A part of or all of the plurality of detection spaces of the fluid flow device according to the present invention may be, alternatively, openable and closable spaces each having one end that is sealed and the other end that is other than the first end, the other end being provided with an opening/closing device which opens/closes the second end.

Figure 24:
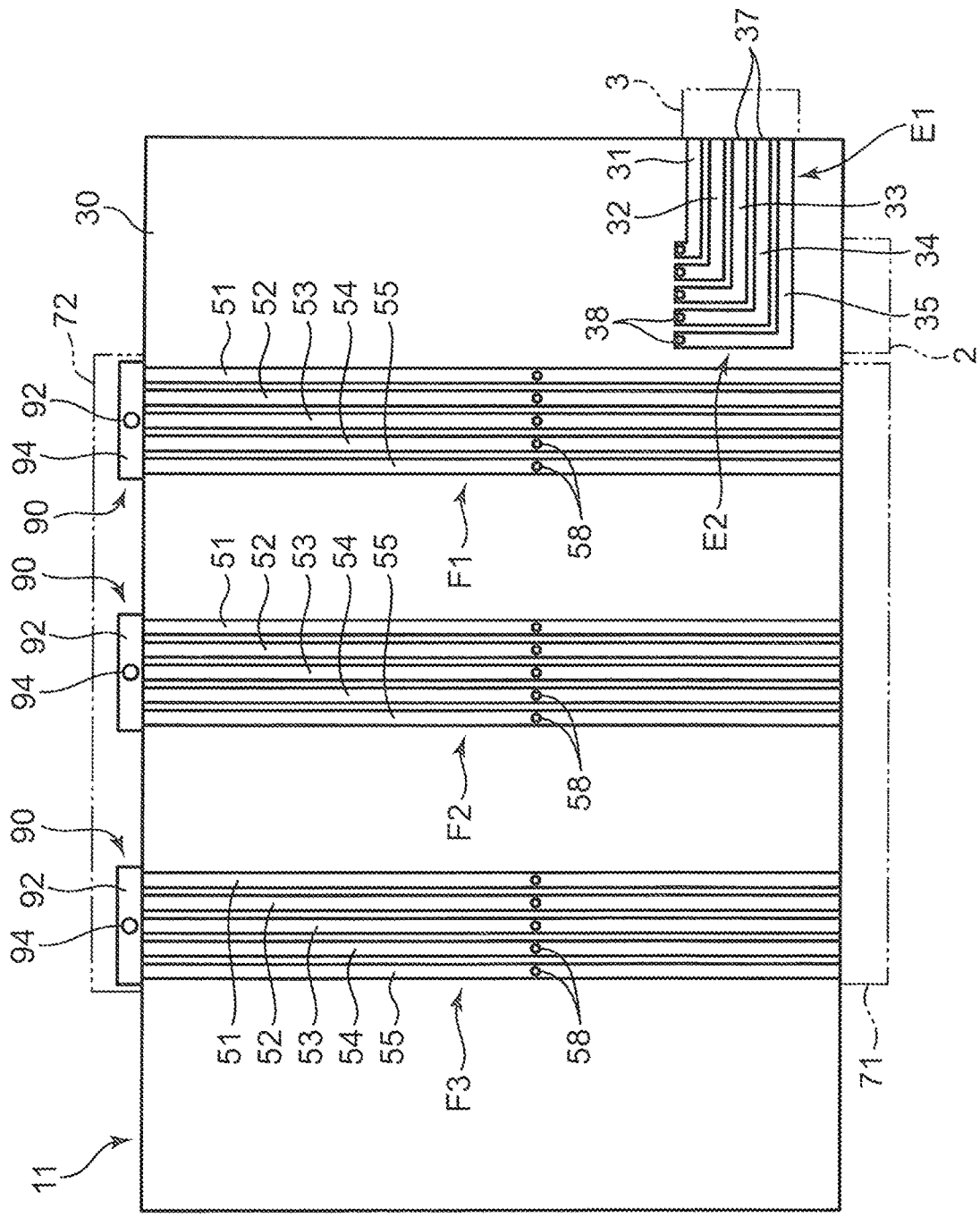
FIG. 24 is a back view of a channel forming plate of a micro-channel reactor as a fluid flow device according to a fifth embodiment of the present invention.
Figure 25:
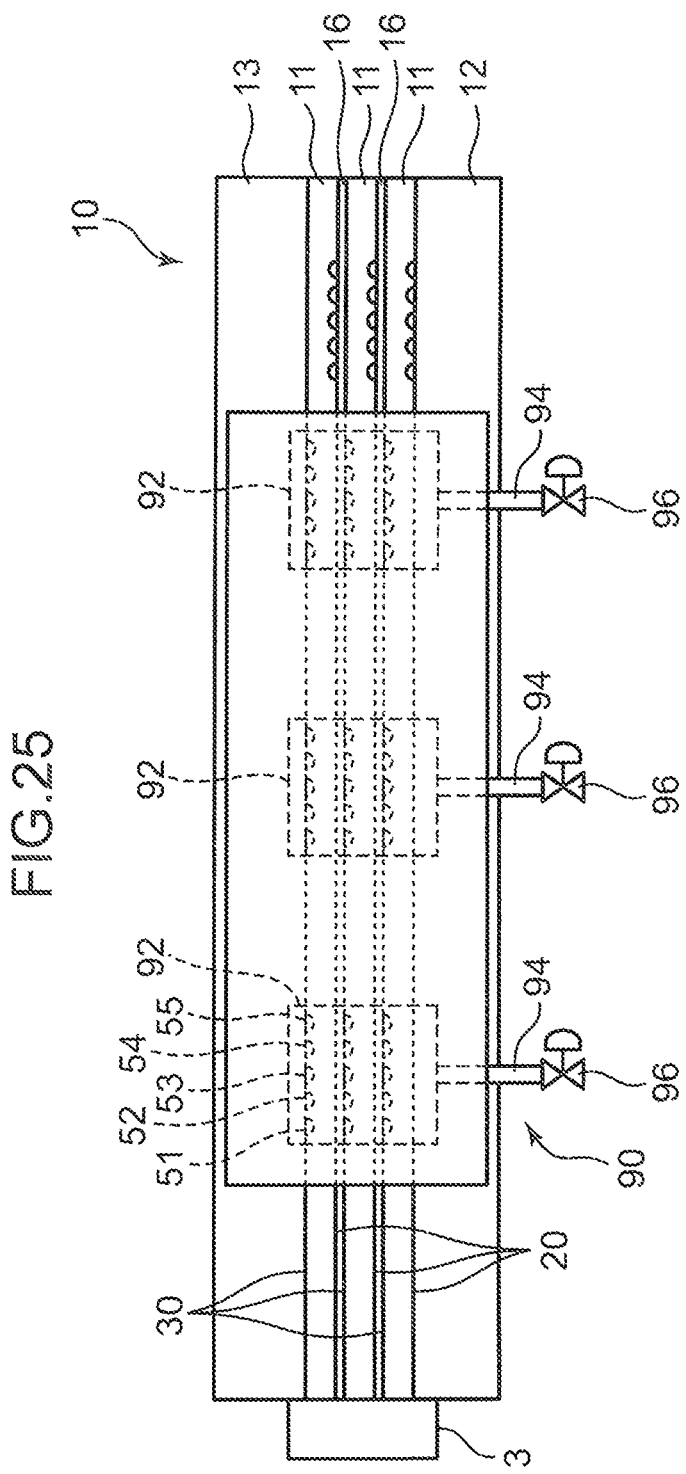
FIG. 25 is a plan view of the micro-channel reactor shown in FIG. 24.

FIG. 24 and FIG. 25 show a main part of a micro-channel according to a fifth embodiment as one example. In the micro-channel, each of the detection-space forming grooves 51 to 55 has a lower end sealed by the light emitting device 71 and an upper end connected to each of a plurality of opening/closing devices 90 provided for each of regions F1, F2, and F3, respectively.

Each of the plurality of opening/closing devices 90 includes a hood 92, a communication tube 94, and a valve 96. The hood 92 covers respective upper ends of a plurality of detection spaces included in the region corresponding to the opening/closing device 90 among the regions F1, F2, and F3. The communication tube 94 is in communication with the inside of the hood 92 and protrudes sideward beyond the hood 92. The valve 96 is coupled with the end portion of the communication tube 94 and openable and closable. Each of the opening/closing devices 90 is switched between an opening state and a closing state through opening/closing of the valve 96. In the opening state, the opening/closing devices 90 open respective upper ends of the plurality of detection spaces for respective opening/closing devices 90 through the communication tube 94 and the valve 96, respectively, thereby allowing the detection gas to go into and out of the detection space. In the closing state, the opening/closing devices 90 seal respective upper ends of the detection spaces.

The hood 92 is interposed between the upper end surface of the channel forming body 10 and the light receiving device 72 in this embodiment. In this case, the hood 92 preferably has light transmittancy enough to allow the light receiving device 72 to receive light.

Provision of the opening/closing devices 90 allows the merit of the fourth embodiment to be obtained while suppressing upsize of the entire device, the merit being increasing the difference between the position of the interface 64 in the normal state and the position of the interface 64 in the state involving an error to thereby allow distinguish both the positions from each other (i.e. judgment of normality/error) to be easily conducted. Specifically, switching the opening/closing device 90 to the opening state (i.e. opening the valve 96 included in the opening/closing device 90) to open each detection space connected to the opening/closing device 90 to air similarly to the fourth embodiment allows the height of the interface 64 in the normal state to be increased. In contrast, when there exists possibility of the situation where the interface 64 in any detection space is too high (i.e. the situation where the interface 64 reaches an upper end and a detection liquid 61 overflows outside the device), switching the opening/closing device 90 connected to the detection space to the closing state (i.e. closing the valve 96 included in the opening/closing device 90) allows the situation to be avoided. For example, when the height of the interface 64 in any of the detection spaces reaches a predetermined allowable height, it is preferable to conduct an operation of closing the valve 96 of the opening/closing device 90 connected to that detection space.

The size and the number of the opening/closing devices according to the present invention are not limited. The opening/closing device may be, for example, a large-sized device which collectively opens/closes one ends of all the detection spaces included in a fluid flow device. Alternatively, may be provided a plurality of opening/closing devices which individually open/close the plurality of detection spaces.

Also in the fourth and fifth embodiments, the direction in which the detection space extends does not have to be vertical. Even when at least a part of a plurality of detection spaces is an open space or an openable and closable space, micro-channels can be arranged so as to allow the open space or the openable and closable space to extend horizontally if each of the detection space has so a small diameter that enough capillarity to hold a detection liquid is generated.

EXAMPLES

In the micro-channel reactor shown in FIG. 1 to FIG. 8, the pressure P1 at a measurement point (e.g. a position of the communication hole 58 in the first detection region F1) when a processing object fluid normally flows through each reaction channel is expressed by Formula (1) below, in which viscosity of the processing object fluid is represented as μ, a flow speed of the processing object fluid is represented as u, a distance from the measurement point to the fluid outlet 28 is represented as L, a channel diameter as an inner diameter of each reaction channel is represented as d, and an outlet pressure is represented as Po.

$$P1 = 32 * \mu * u * L/d^2 + Po \quad (1)$$

In the case of occurrence of, for example, full occlusion in the reaction channel, the processing object fluid cannot flow through the reaction channel, making the flow speed u be 0; therefore, the pressure P2 at the measurement point then is expressed by Formula (2) below.

$$P2 = Po \quad (2)$$

The position of the interface 64 is lowered by an amount of the above pressure change ΔP (=P2−P1), thereby increasing the distance from the upper end of the detection space to the interface 64, namely, the gas height size H as the height size of a region occupied by the detection gas 62. With the gas height size in the normal state represented as H1 and the gas height size in a completely closing state represented as H2, the relationship between both the sizes is expressed by Formula (3) below.

$$H2 = H1 * P1/P2 \quad (3)$$

Accordingly, the change amount ΔH of the gas height size involved by the pressure change ΔP is expressed by Formula (4) below.

$$\Delta H = H2 - H1 = H1(P1/P2 - 1) \quad (4)$$

The following Table 1 shows an amount of change in a gas height size corresponding to various channel diameters d and the initial gas height size H1 in the case where the measurement point pressure is reduced to the atmospheric pressure at the time of an error when viscosity μ of the processing object fluid is 0.001 Pa·s, the flow speed u of the processing object fluid in the normal state is 100 mm/s, the distance L from the measurement point to the channel outlet is 10 m, and the outlet pressure Po is atmospheric pressure (≈100 kPaA).

TABLE 1

| | | Change of channel diameter d | | | Change of initial gas height size H1 | | |
|---|---|---|---|---|---|---|---|
| Channel diameter d | (mm) | 0.5 | 1.0 | 2.0 | 1.0 | 1.0 | 1.0 |
| Channel cross-section | (mm²) | 0.2 | 0.8 | 3.1 | 0.8 | 0.8 | 0.8 |
| Initial gas height size H1 | (mm) | 200.0 | 200.0 | 200.0 | 200.0 | 400.0 | 600.0 |
| Measurement point pressure P1 in normal state | (kPaA) | 229.3 | 133.3 | 109.3 | 133.3 | 133.3 | 133.3 |
| Measurement point pressure P2 at the time of error | (kPaA) | 100.0 | 100.0 | 100.0 | 100.0 | 100.0 | 100.0 |
| Height size H2 at the time of error | (mm) | 458.6 | 266.6 | 218.6 | 266.6 | 533.2 | 799.8 |
| Change amount ΔH of gas height size | (mm) | 258.6 | 66.6 | 18.6 | 66.6 | 133.2 | 199.8 |

Focusing on the case of the channel diameter d of 2.0 mm in Table 1, the gas height size change amount ΔH in this case, that is, the difference between the interface height in the normal state and the interface height at the time of an error is as small as 18.6 mm. Furthermore, this value is decreased with decrease in the viscosity of a processing object fluid, with decrease in the flow speed of the processing object fluid, and decrease in the distance from the measurement point to a channel outlet. And, the smaller the difference becomes, the more difficult determination becomes whether a flow in the fluid channel is normal or involves an error.

However, opening an upper end of at least a part of the detection spaces (all the detection spaces in FIG. 22) to make it be an open space to allow a detection gas to go in/out of the open space makes it possible to further increase the interface position in the normal state and increase the difference by the amount thereof. For example, in the case of opening respective upper ends of the detection space as shown in FIG. 22, the pressure corresponding to a liquid column height (a size of a detection liquid from the communication hole 58 to the interface 64) in the detection space is balanced with a measurement point pressure, which makes the liquid column height in the normal state be 10000×(109.3−101.3)/101.3=789.7 mm when the distance L is 10 m (=10000 mm) and the measurement point pressure P1 in the normal state is 109.3 kPaA as shown in Table 1. In contrast, if the channel is fully occluded to make the measurement point pressure be atmospheric pressure, the liquid column height is 0 mm. Thus, the difference between respective liquid column heights in the normal state and at the time of an error, i.e., the difference between the interfaces, is a very large value, 789.7 mm. This makes the determination of error presence/absence be considerably easy.

Furthermore, in the case of replacing the open space with an openable and closable space, for example, a space in which the opening/closing device 90 as shown in FIG. 24 and FIG. 25 is connected to the upper end, closing the valve 96 of the opening/closing device 90 at a time point when the interface height in the normal state draws near to the upper end of the detection space enables a detection liquid to be prevented from an outflow. This facilitates error detection without unnecessarily increasing a length of the detection space in order to reliably prevent the outflow (i.e. without excessively increasing a height size of the device as a whole).

As described in the foregoing, according to the present invention, a fluid flow device which forms a plurality of fluid channels through which a processing object fluid is caused to flow is provided, the device having an increased degree of freedom of choosing means for detecting a flow error of a processing object fluid in the fluid channel.

Provided is a fluid flow device including a channel forming body which forms a plurality of fluid channels that allow respective processing object fluids to flow through the fluid channels, a plurality of detection spaces corresponding to the plurality of fluid channels, each of the plurality of spaces extending in a longitudinal direction and having opposite ends with respect to the longitudinal direction, at least one of the opposite ends being sealed, and a plurality of communication channels each connected to a channel connection part that is set at each of the plurality of fluid channels and to a space connection part that is set in the detection space corresponding to the fluid channel to thereby provide communication between the channel connection part and the space connection part; and detection liquids and detection gases that are contained in the plurality of detection spaces, respectively. Each of the detection liquids and each of the detection gases are contained in the detection space so as to be aligned in the longitudinal direction of the detection space to form an interface between the detection liquid and the detection gas and so that a region where the detection liquid exists includes the space connection part. The detection gas is contained in the detection space so as to allow a position of the interface to change with a pressure change of the processing object fluid at the channel connection part.

According to the fluid flow device, the pressure of each of the processing object fluids at the channel connection part in each of the plurality of fluid channels is converted into the position of the interface between the detection liquid and the detection gas contained in the detection space. This eliminates an necessity of directly detecting a pressure of a processing object fluid in the fluid channel for detecting a flow error of a processing object fluid in the fluid channel, which makes it possible to precisely detect the flow error by a flow error detection method that includes detecting the position of the interface corresponding to the pressure and determining presence/absence of a flow error based on the change in the position of the interface from a normal state. This drastically enhances freedom of choosing means for detecting the flow error.

At least a part of the plurality of detection spaces may be a sealed space in which each of the opposite ends is the sealed end. In this case, the detection gas enclosed in the sealed space is preferably capable of expanding and contracting in the longitudinal direction so as to allow the position of the interface to change with a pressure change of the processing object fluid at the channel connection part.

Alternatively, it is also possible that at least a part of the plurality of detection spaces is an open space where only one end of the opposite ends in the longitudinal direction is sealed while the other end of the opposite ends is opened, and that the detection gas in the open space go in and out of the open space so as to allow the position of the interface to change with a pressure change of the processing object fluid at the channel connection part. Thus opening the one end of the detection space makes it possible to make the difference between the position of an interface in the normal state and the position of the interface at the time of an error be larger than that in the case where both the opposite ends of the detection space are sealed, thereby further facilitating error detection.

Alternatively, it is also possible that at least a part of the plurality of detection spaces is an openable and closable space in which one end of the opposite ends in the longitudinal direction is sealed while an opening/closing device is connected to the other end of the opposite end, the opening/closing device being switchable between a closing state of sealing the end to which the opening/closing device is connected and an opening state of opening the end to which the opening/closing device is connected to allow the detection gas to go in and out of the openable and closable space, the detection gas being capable of expanding and contracting in the longitudinal direction so as to allow the position of the interface to change with a pressure change of the processing object fluid at the channel connection part when the opening/closing device is in the closing state. The opening/closing device facilitates error detection by making the space with a valve be equal to the open space in the opening state, while opening/closing device can prevent the detection liquid from outflow from the detection space to the outside by being appropriately switched to the closing state.

In the case where the plurality of detection spaces include the openable and closable space, the flow error detection method preferably further includes switching the opening/closing device that is provided in the openable and closable space, between the opening state and the closing state according to the position of the interface in the openable and closable space.

The position of the interface can be optically detected, for example, by use of a light emitting device which emits a measurement light beam in the detection space along the longitudinal direction of the space and a light receiving device which receives the measurement light beam and outputs a signal corresponding to intensity of the light beam. This allows the flow error to be detected with simple and low-cost means. Specifically, the position of the interface can be detected by emitting a measurement light beam to the detection liquid from the light emitting device and detecting intensity of a light beam that is included in the measurement light beams and has passed through the detection liquid, by the light receiving device, or emitting the measurement light beam to the interface through the detection gas and detecting intensity of a light beam having been reflected by the interface, by the light receiving device.

In either case, the light emitting device and the light receiving device can be shared for the plurality of detection spaces. This reduces the necessary number of light emitting devices and light receiving devices in comparison with the case where a light emitting device and a light receiving device are provided for each of the plurality of detection spaces, to thereby enable error detection to be conducted at low costs. The flow error can be detected also when a light emitting device and a light receiving device are provided for each of the plurality of detection spaces.

For the determination of the flow error, various methods can be adopted. For example, it is possible to determine that a flow error occurs when a difference between a predetermined initial position with respect to the position of the interface and a detected position of the interface exceeds an allowable range. In this case, respective initial positions of the plurality of detection spaces may be set to be the same or different from each other. In the latter case, it is possible to determine that a flow error occurs when variation in the position of the interface exceeds an allowable range.

Regarding the arrangement of the plurality of fluid channels and the corresponding plurality of detection spaces, it is preferable that the plurality of fluid channels extend parallel to each other along a first plane and the plurality of detection spaces extend along a second plane which extends along the first plane while being spaced in a direction of a normal line from the first plane. The arrangement enables the detection of the flow of a processing object fluid and a flow error to be realized with a compact structure.

More preferably, the plurality of detection spaces extend along the fluid channels corresponding to the detection spaces. This allows the structure to be more conspicuously compacted.

More preferably, each of the plurality of communication channels includes a separation space interposed between the fluid channel corresponding to the communication channel and the detection space to be in communication with the fluid channel and the detection space, and a separation gas interposed between a processing object fluid flowing through the fluid channel and the detection liquid is contained in the separation space. The separation space and the separation gas contained therein hinder the processing object fluid flowing through the fluid channel and the detection liquid from direct contact with each other, thereby preventing the detection liquid from affecting properties and condition of the processing object fluid. This enhances freedom of choosing a substance to form the detection liquid.

For example, in the case where the plurality of fluid channels extend parallel to each other along the first plane and the plurality of detection spaces extend parallel to each other along the second plane which is parallel to the first plane, it is preferable that the plurality of separation spaces extend parallel to each other along a third plane interposed between the first plane and the second plane and being in parallel to the first plane and the second plane. This makes it possible to hinder contact between the processing object fluid and the detection liquid in addition to detecting a flow of a processing object fluid and a flow error of the same, with a compact structure.

The channel forming body preferably includes a part that seals at least one end of each of the detection spaces in the longitudinal direction, the part having light transmittancy which allows light to be transmitted from the outside of the channel forming body to the at least one end. The part having such light transmittancy enables a measurement light beam to be emitted from the outside of the channel forming body into the detection space, thereby facilitating optical detection of a position of the interface.

The fluid flow device according to the present invention preferably further includes an interface position detector which detects the position of the interface. Preferably, the interface position detector is configured to optically detect the position of the interface, including a light emitting device which emits a measurement light beam in the detection space along the longitudinal direction of the space and a light receiving device which receives the measurement light beam and outputs a signal corresponding to intensity of the light beam. Specifically, it is preferable that the light receiving device is disposed so as to receive a light beam that is included in the measurement light beam emitted from the light emitting device to the detection liquid and has passed through the detection liquid. Alternatively, it is also preferable that the light emitting device is disposed so as to emit the measurement light beam to the interface through the detection gas and the light receiving device is disposed so as to receive a light beam that is included in the measurement light beam and has been reflected by the interface.

The invention claimed is:

1. A fluid flow device which causes a processing object fluid to flow, comprising:
   a channel forming body which forms a plurality of fluid channels that allow respective processing object fluids to flow through the fluid channels, a plurality of detection spaces corresponding to the plurality of fluid channels, each of the plurality of spaces extending in a longitudinal direction and having opposite ends with respect to the longitudinal direction, at least one of the opposite ends being sealed, and a plurality of communication channels each connected to a channel connection part that is set at each of the plurality of fluid channels and to a space connection part that is set in the detection space corresponding to the fluid channel to thereby provide communication between the channel connection part and the space connection part; and
   detection liquids and detection gases that are contained in the plurality of detection spaces, respectively, wherein:
   the channel forming body includes at least one plate layer, in which the plurality of fluid channels are arranged in one major surface of the plate layer, and the plurality of spaces are formed in the other major surface on an opposite side of the plate layer;
   each of the detection liquids and each of the detection gases are contained in the detection space so as to be aligned in the longitudinal direction of the detection space to form an interface between the detection liquid and the detection gas and so that a region where the detection liquid exists includes the space connection part; and
   the detection gas is contained in the detection space so as to allow a position of the interface to change with a pressure change of the processing object fluid at the channel connection part.

2. The fluid flow device according to claim 1, wherein at least a part of the plurality of detection spaces is a sealed space in which each of the opposite ends is the sealed end, and the detection gas enclosed in the sealed space is capable of expanding and contracting in the longitudinal direction so as to allow the position of the interface to change with a pressure change of the processing object fluid at the channel connection part.

3. The fluid flow device according to claim 1, wherein at least a part of the plurality of detection spaces is an open space where only one end of the opposite ends in the longitudinal direction is sealed while the other end of the opposite ends is opened, and the detection gas in the open space go in and out of the open space so as to allow the position of the interface to change with a pressure change of the processing object fluid at the channel connection part.

4. The fluid flow device according to claim 1, wherein at least a part of the plurality of detection spaces is an openable and closable space in which one end of the opposite ends in the longitudinal direction is sealed while an opening/closing device is connected to the other end of the opposite end, the opening/closing device being switchable between a closing state of sealing the end to which the opening/closing device is connected and an opening state of opening the end to which the opening/closing device is connected to allow the detection gas to go in and out of the openable and closable space, the detection gas being capable of expanding and contracting in the longitudinal direction so as to allow the position of the interface to change with a pressure change of the processing object fluid at the channel connection part when the opening/closing device is in the closing state.

5. The fluid flow device according to claim 1, wherein the plurality of fluid channels extend parallel to each other along a first plane and the plurality of detection spaces extend along a second plane which extends along the first plane while being spaced in a direction of a normal line from the first plane.

6. The fluid flow device according to claim 5, wherein the plurality of detection spaces extend along the fluid channels corresponding to the detection spaces, respectively.

7. The fluid flow device according to claim 1, wherein each of the plurality of communication channels includes a separation space interposed between the fluid channel corresponding to the communication channel and the detection space to be in communication with the fluid channel and the detection space, and a separation gas interposed between a processing object fluid flowing through the fluid channel and the detection liquid is contained in the separation space.

8. The fluid flow device according to claim 7, wherein: the plurality of fluid channels extend parallel to each other along a first plane; the plurality of detection spaces extend along a second plane which extends along the first plane while being spaced in a direction of a normal line from the first plane and along the fluid channel that corresponds to the detection space; and
the plurality of separation spaces extend along a third plane interposed between the first plane and the second plane and along the fluid channel and the detection space that correspond to the separation space.

9. The fluid flow device according to claim 1, wherein includes a part that seals at least one end of each of the detection spaces in the longitudinal direction, the part having light transmittancy which allows light to be transmitted from the outside of the channel forming body to the at least one end.

10. The fluid flow device according to claim 1, further comprising an interface position detector which detects the position of the interface.

11. The fluid flow device according to claim 10, wherein the interface position detector is configured to optically detect the position of the interface, including a light emitting device which emits a measurement light beam in the detection space along the longitudinal direction of the space and a light receiving device which receives the measurement light beam and outputs a signal corresponding to intensity of the light beam.

12. The fluid flow device according to claim 11, wherein the light receiving device is disposed so as to receive a light beam that is included in the measurement light beam emitted from the light emitting device to the detection liquid and has passed through the detection liquid.

13. The fluid flow device according to claim 11, wherein the light emitting device is disposed so as to emit the measurement light beam to the interface through the detection gas and the light receiving device is disposed so as to receive a light beam that is included in the measurement light beam and has been reflected by the interface.

14. The fluid flow device according to claim 1, wherein the plate layer consists of a single plate.

15. The fluid flow device according to claim 1, wherein the plate layer comprises two separate plates that are laminated together.

16. A method for detecting a flow error of the processing object fluid in the plurality of fluid channels in the fluid flow device according to claim 1, the method comprising:
detecting a position of the interface in each of the plurality of detection spaces; and
determining presence/absence of the flow error based on a change of the position of the interface from a normal state.

17. A method for detecting a flow error of the processing object fluid in the plurality of fluid channels in the fluid flow device according to claim 4, the method comprising:
detecting a position of the interface in each of the plurality of detection spaces;
determining presence/absence of the flow error based on a change of the position of the interface from a normal state: and
switching the opening/closing device that is connected to the openable and closable space, between the opening state and the closing state, according to the position of the interface in the openable and closable space.

18. The flow error detection method of a fluid flow device according to claim 16, wherein the position of the interface is optically detected by use of a light emitting device which emits a measurement light beam in the detection space along the longitudinal direction of the space and a light receiving device which receives the measurement light beam and outputs a signal corresponding to intensity of the light beam.

19. The flow error detection method of a fluid flow device according to claim 18, wherein respective positions of the interfaces are detected by use of a light emitting device and a light receiving device that are shared for the plurality of detection spaces.

20. The flow error detection method of a fluid flow device according to claim 16, wherein it is determined that a flow error occurs, when a difference between a predetermined initial position with respect to the position of the interface and a detected position of the interface exceeds an allowable range.

* * * * *